United States Patent [19]

Burns et al.

[11] Patent Number: 5,559,358

[45] Date of Patent: Sep. 24, 1996

[54] OPTO-ELECTRO-MECHANICAL DEVICE OR FILTER, PROCESS FOR MAKING, AND SENSORS MADE THEREFROM

[75] Inventors: David W. Burns, Minneapolis, Minn.; Henry Guckel, Madison, Wis.; James D. Zook, Minneapolis, Minn.

[73] Assignee: Honeywell Inc., Minneapolis, Minn.

[21] Appl. No.: 247,911

[22] Filed: May 23, 1994

Related U.S. Application Data

[63] Continuation-in-part of Ser. No. 67,872, May 25, 1993, abandoned.

[51] Int. Cl.$^6$ .................................................. H01L 29/82
[52] U.S. Cl. ...................... 257/431; 257/415; 257/417; 257/434; 257/436; 73/579; 73/778; 73/862.59
[58] Field of Search .................................. 73/579, 862.59, 73/778; 257/431, 434, 436, 415, 417

[56] References Cited

U.S. PATENT DOCUMENTS

| | | | |
|---|---|---|---|
| 4,672,849 | 6/1987 | Hoshino | 73/579 |
| 4,733,561 | 3/1988 | Gilby | 73/579 |
| 4,841,775 | 6/1989 | Ikeda et al. | |
| 4,926,143 | 5/1990 | Harada et al. | |
| 4,966,649 | 10/1990 | Harada et al. | |
| 5,009,108 | 4/1991 | Harada et al. | |
| 5,060,526 | 10/1991 | Barth et al. | 73/862.59 |
| 5,123,282 | 6/1992 | Ikeda et al. | |
| 5,165,289 | 11/1992 | Tilmans | 73/862.59 |

FOREIGN PATENT DOCUMENTS

| | | | |
|---|---|---|---|
| 0400939 | 12/1990 | European Pat. Off. | |
| 0451992 | 10/1991 | European Pat. Off. | |
| 2252825 | 8/1992 | United Kingdom | 73/862.59 |
| 93/04347 | 3/1993 | WIPO | 73/579 |

OTHER PUBLICATIONS

IEEE Micro Electro Mechanical Systems Conference, 7 Feb. 1993, Ft. Lauderdale, FL, USA pp. 230–235, K. Aratani, et al. 'Process and Design Considerations for Surface Micromachined Beams for a Tuneable Interferometer Array n Silicon'.

Journal of Vacuum Science & Technology: Part A., vol. 8, No. 4, Jul. 1990, NY –US pp. 3606–3613, D. W. Burns, et al. 'Thin Films for Miocromechanical Sensors'.

Optical Engineering, vol. 31, No. 8, Aug. 1992, Bellingham US –pp. 1638–1642–D. Angelidis, et al. 'Optical Micromachined Pressure Sensor for Aerospace Applications'.

Sensors & Actuators, vol. 20, No. 1–2, 15 Nov. 1989, Lausanne CH, pp. 143–151, M. W. Putty et al., 'Process Integration for Active Polysilicon Resonant Microstructures'.

Sensors & Actuators, vol. A21–A23, No. 1–3, Feb. 1990, Lausanne CH, pp. 387–390, R. J. Pitcher, et al. 'Optothermal Drive of Silicon Resonators: The Influence of Surface Coatings'.

Electronics Letters, vol. 22, No. 21, 9 Oct. 1986, Stevenage GB, pp. 1097–1099, M. V. Andres, et al. 'Optical Activation of a Silicon Vibrating Sensor'.

(List continued on next page.)

*Primary Examiner*—Sara W. Crane
*Attorney, Agent, or Firm*—Ian D. Mackinnon

[57] ABSTRACT

The present invention relates to microstructures fabricated from semiconductor material and having a flexible member which is excited into various modes of resonance and in which such resonance is read optically. By coupling the microstructure to a surface or material of interest, a drive means will excite the flexible member into a characteristic resonance which when read optically gives indication of certain physical phenomena influencing the surface or material of interest. The microstructures of the present invention may be configured to self-resonate, as a so-called active device, under certain conditions. Many different physical phenomena may be quantified using the device of the present invention.

49 Claims, 15 Drawing Sheets

OTHER PUBLICATIONS

IEE Proceedings D. Control Theory & Applications, vol. 135, No. 5, Sep. 1988, Stevenage GB, pp. 364–368, M. J. Tudor et al., 'Silicon Resonator Sensors: Interrogation Techniques and Characteristcs'.

"Optical Drive/Sense For High Q Resonant Microbeams", H. Guckel & M. Nesnidal, University of Wisonsin Center for Applied Microelectronics, Madison, WI, J. D. Zoon & D. W. Burns, Honeywell Inc., Sensors & System Development Center, Bloomington, MN.

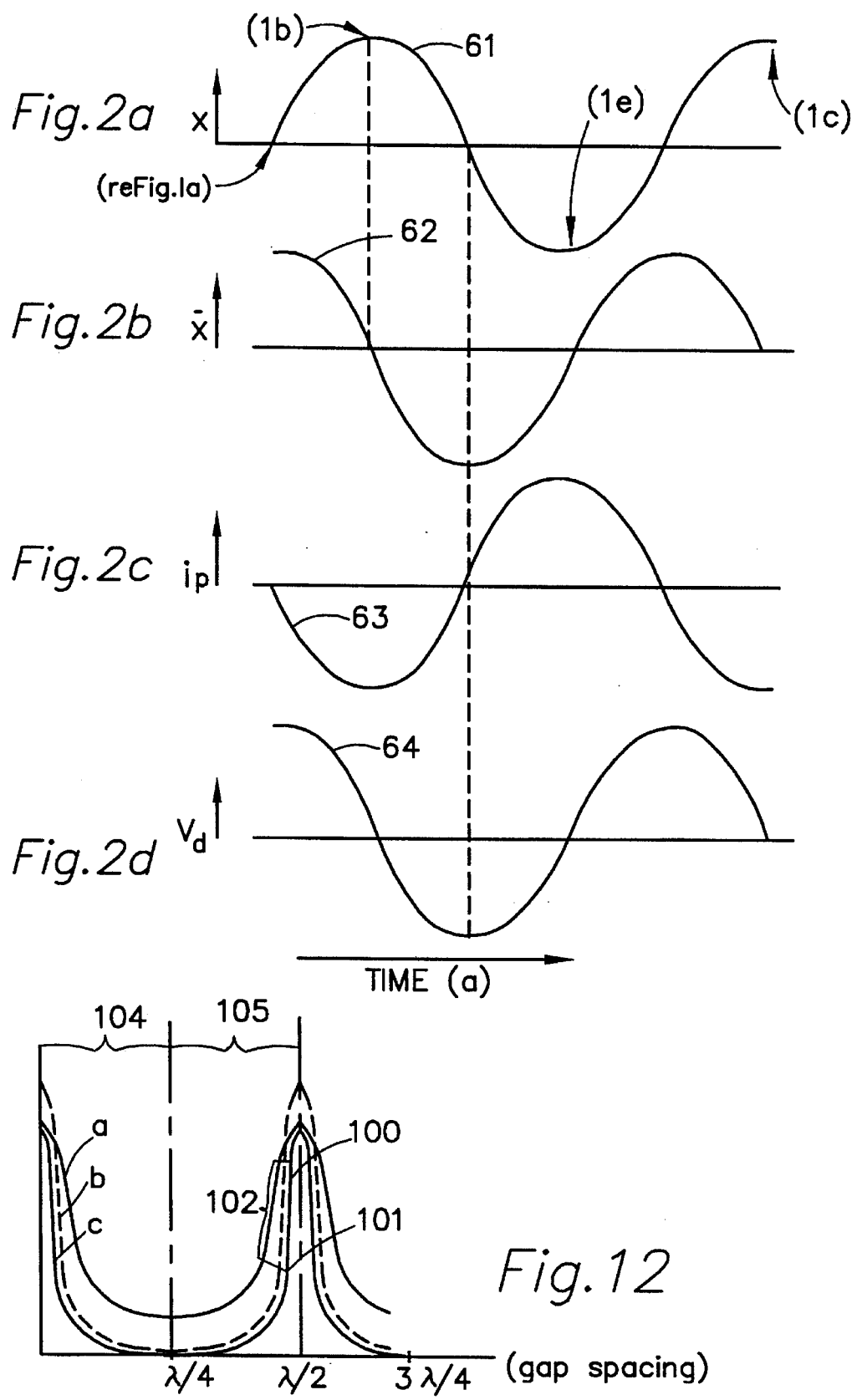

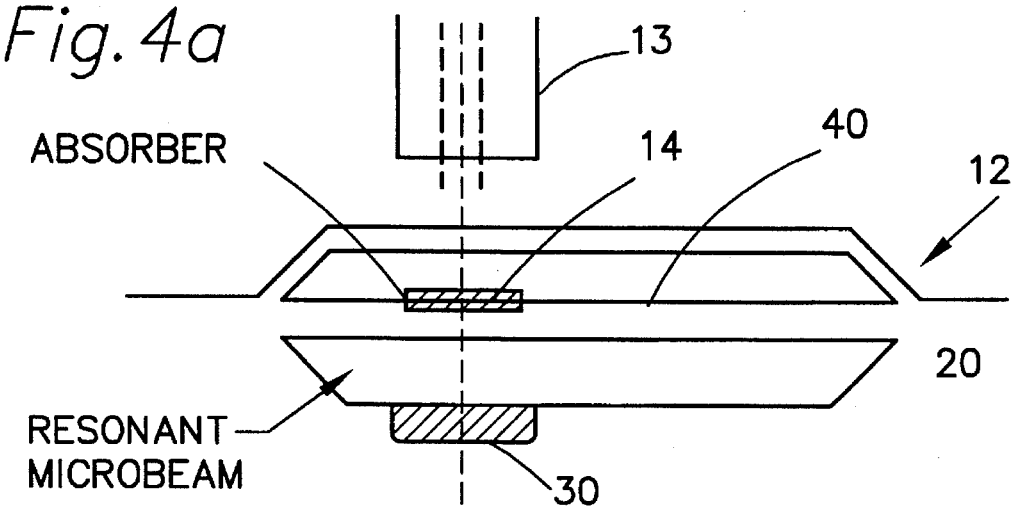
Fig. 4a
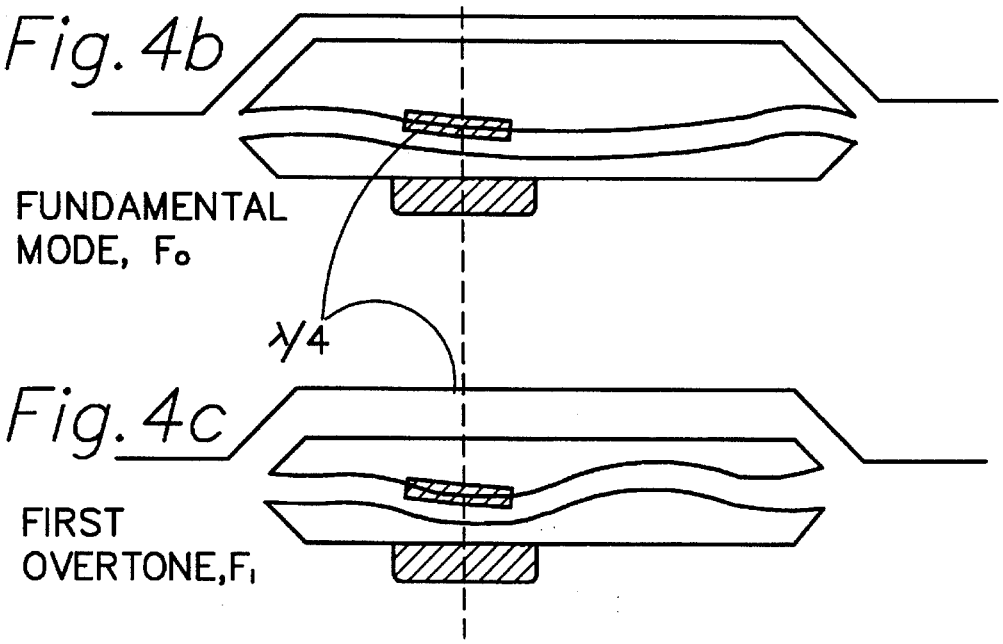
Fig. 4b — FUNDAMENTAL MODE, $F_o$
Fig. 4c — FIRST OVERTONE, $F_1$
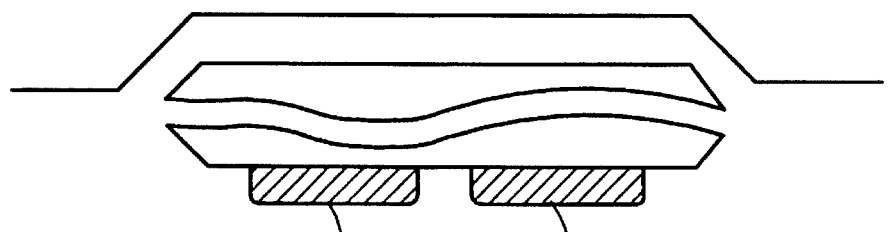
Fig. 4d

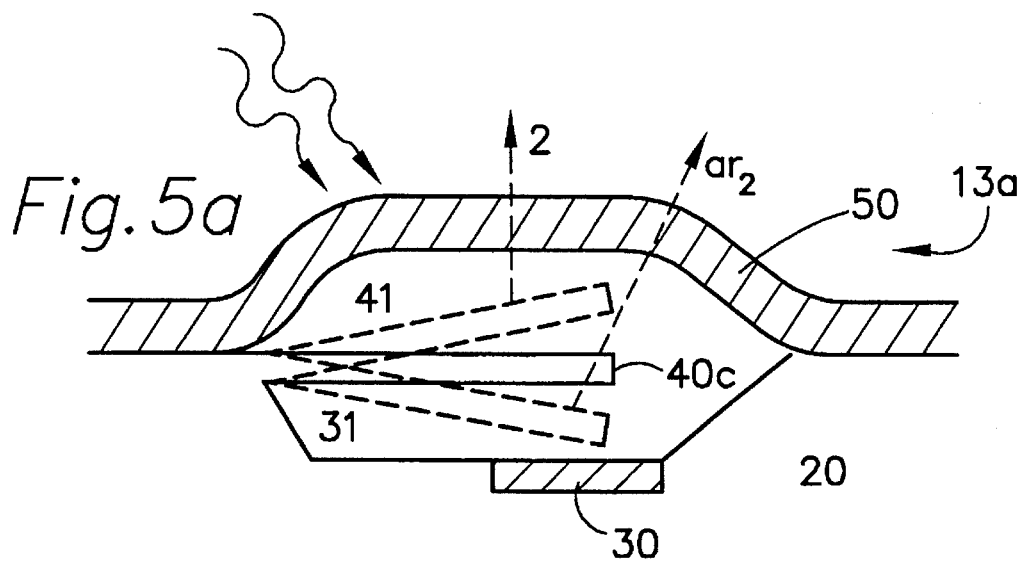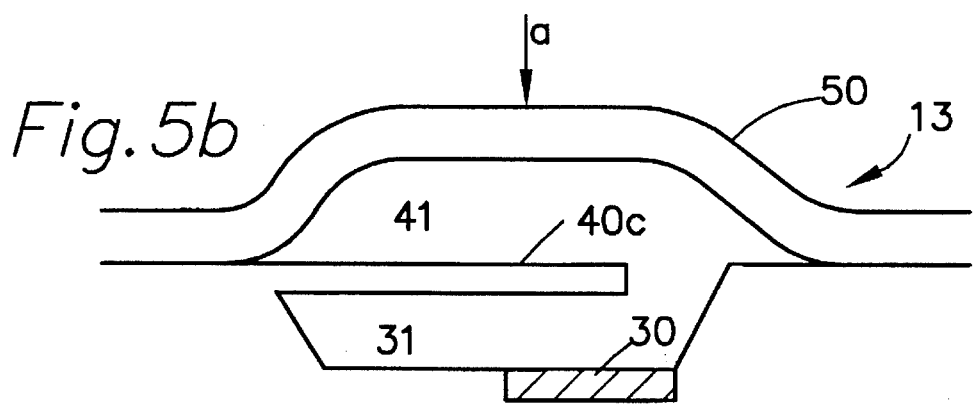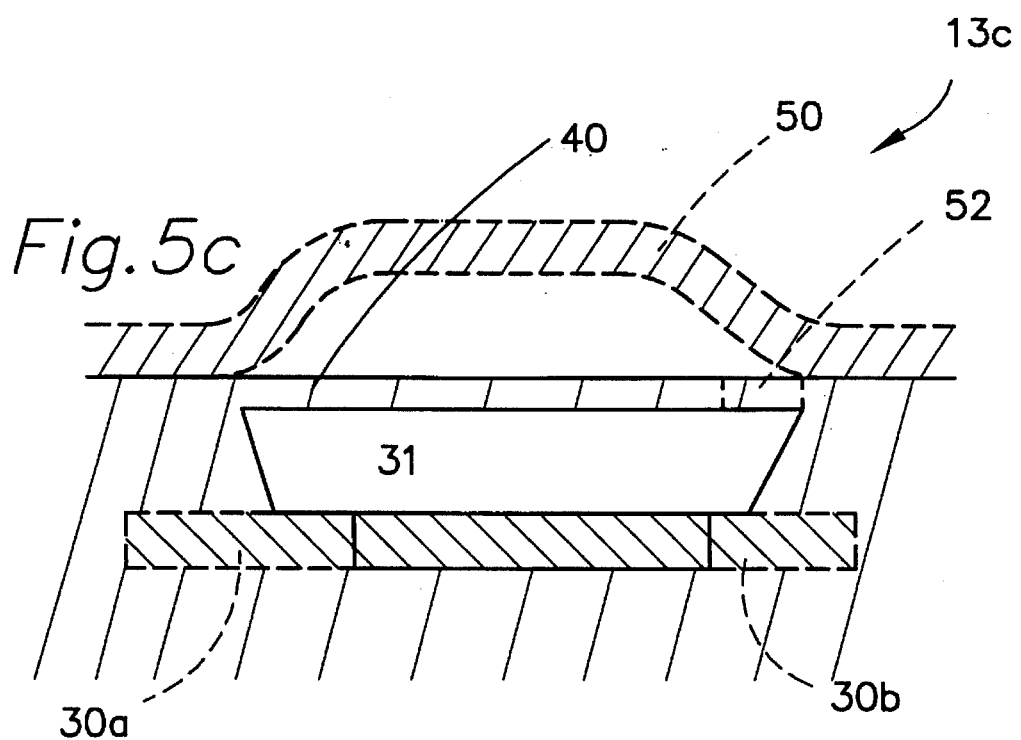

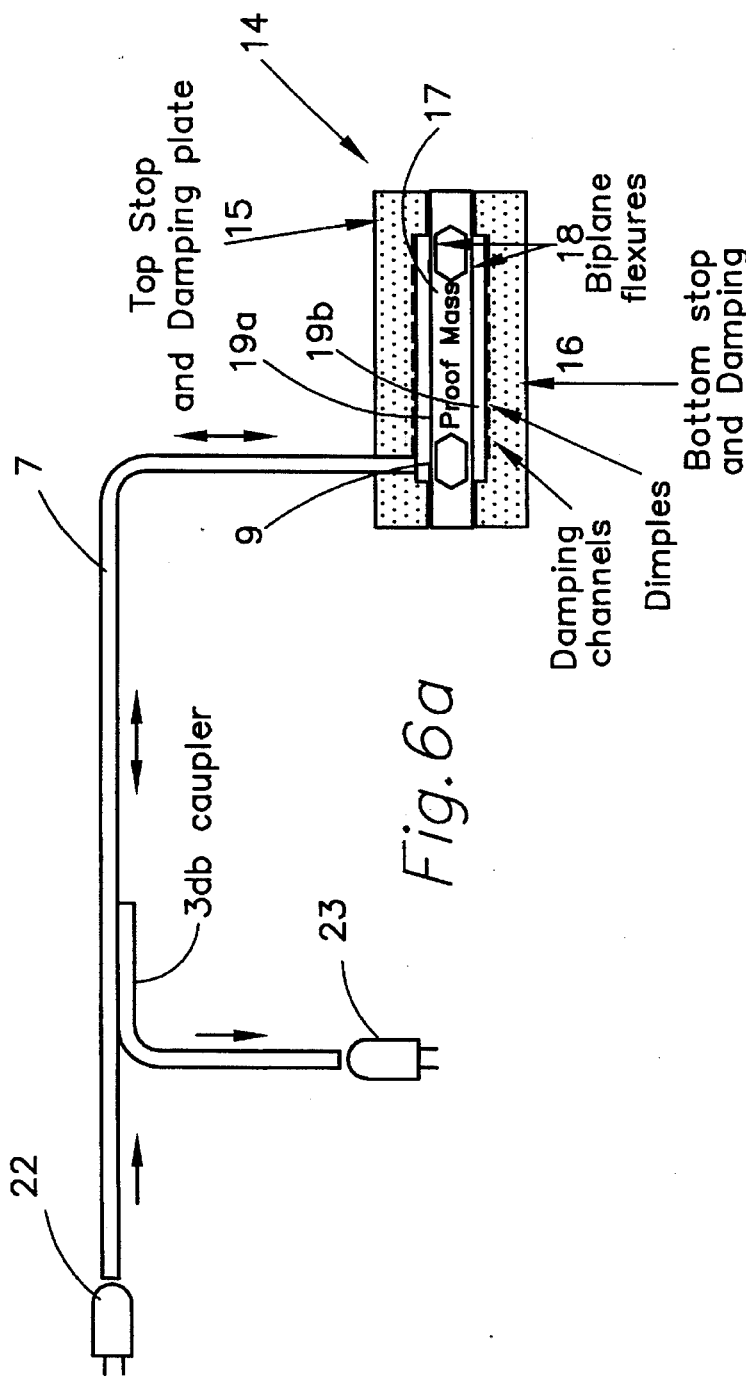
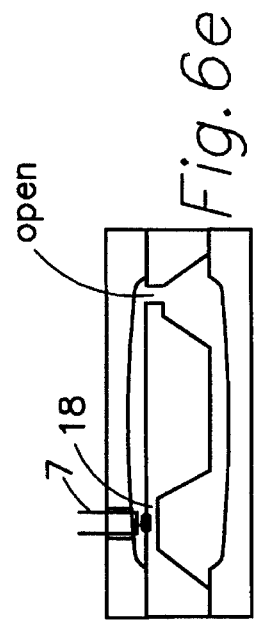
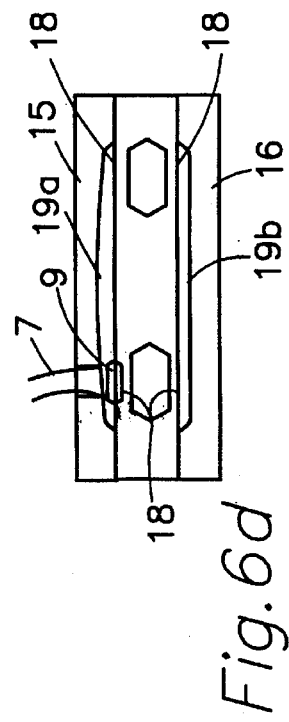

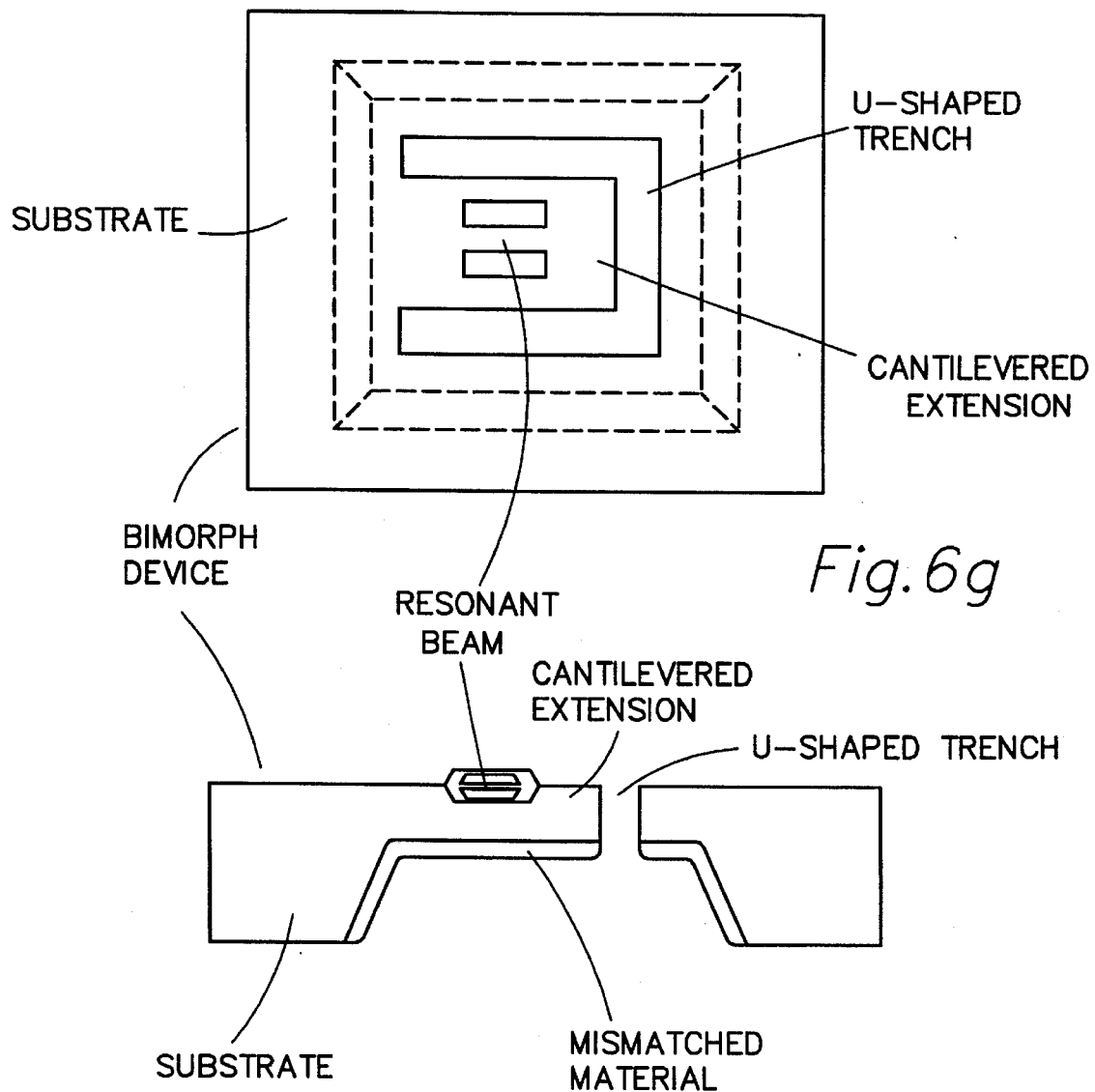
Fig. 6f  BIMORPH-BASED SENSOR

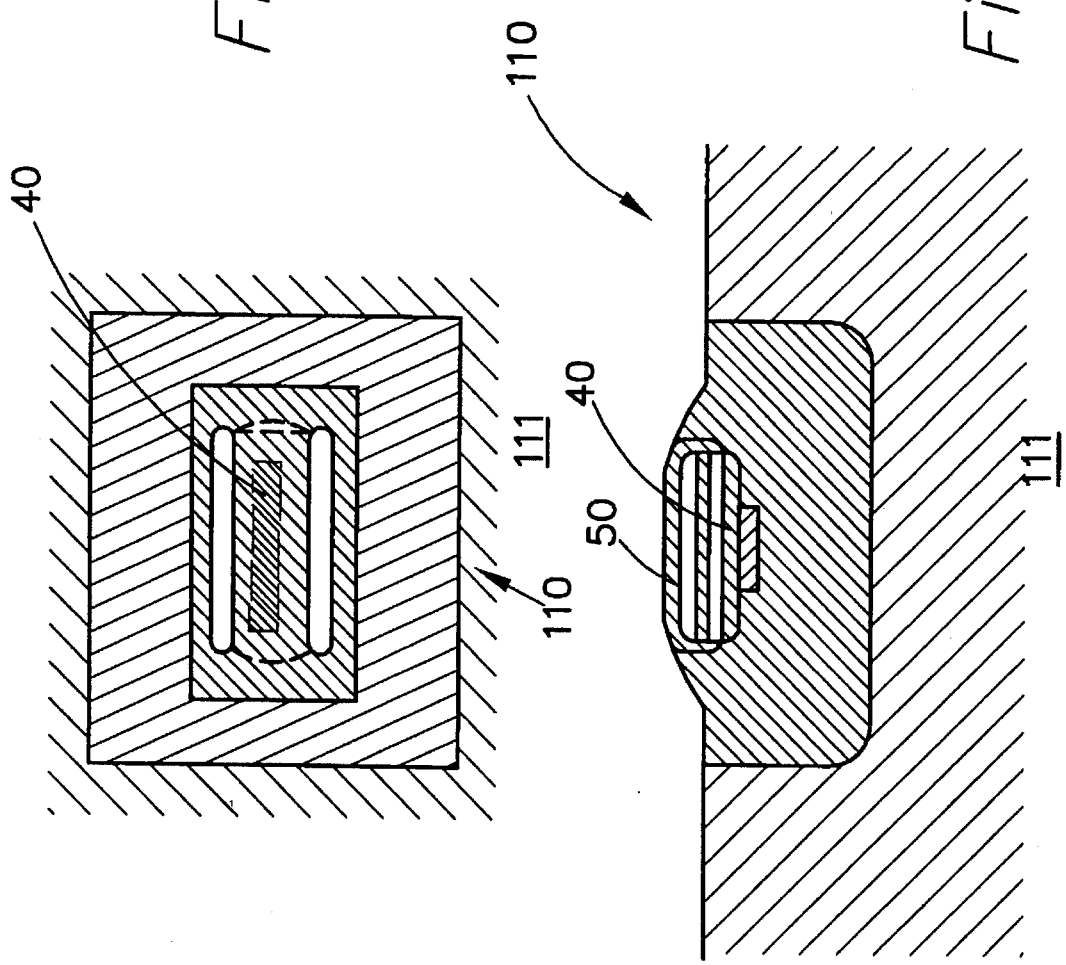

OPTO-ELECTRO-MECHANICAL DEVICE OR FILTER, PROCESS FOR MAKING, AND SENSORS MADE THEREFROM

This application is a continuation-in-part, of application Ser. No. 08/067,872, filed May 25, 1993, abandoned.

This invention relates to devices and their applications which employ a resonant semiconductor member whose vibratory motion is coupled to the radiant energy cast onto a photovoltaic energy conversion device. It also relates to such devices whose vibratory behavior is otherwise affected and which affect can be read optically. These devices may even be self-resonant. Throughout this patent, the terms light and optical or radiant energy are used as equivalent terms and intended to have their broadest meaning, covering all useful forms of radiant energy.

BACKGROUND OF THE INVENTION

To date no known resonant devices have been driven with direct optical-electro-mechanical coupling. This invention is, and is readable optically. There have been some opto-thermal-mechanical devices driven by temperature changes resulting from absorbed radiation which are described in the literature, however these devices use neither the structures nor principles taught here. For reference to opto-thermal drives, see for example "Optical Micromachined Pressure Sensor for Aerospace Applications", by Diogenes Angelidia and Philip Parsons, Optical Engineering, Vol. 31(1992) pp. 1638–1642. See also "Optical Excitation of Mechanical Microresonators", Kozel, et al, Soviet Tech. Phys. Lett. 17(11), Nov. 1991 0360-120X/91/11 0 804-02 (© Am. Inst. of Physics, 1992), and "Photothermal Self-Excitation of Mechanical Microresonators", also Kozel, et al, Opt. Spectroscopy (USSR) 69 (3), Sept. 1990, 0030-400x/90/090401-02 (© 1991, The Optical Society of America).

Other interesting variations for resonant beam drives are described in "Optical Fiber Sensors Using Micromechanical Silica Resonant Elements" by Jones, Naden and Neat, IEE vol. 135(part D)(1988) pp 353-8 and in "Photoacoustic Oscillator Sensors" by Langdon and Dowe, SPIE, Vol. 798, Fiber Optic Sensors II (1987), pp 86–93. It should be noted that in the Jones, Naden and Neat article, these researchers were convinced that it would be possible to construct a self-resonant device that was excited optothermally (using the thermoelastic effect), although they believed silicon for this purpose was unsuitable (page 358). U.S. Pat. No. 5,188,983 assigned to Wisconsin Alumni Research Foundation, inventors being Geckel and Sniegowski, and an International Application No. PCTUS93/08404 assigned to Honeywell Inc., inventors being Zook and Burns, describe relevant teaching within the prior art relative to resonant microbeams incorporating electrostatic drive and piezoresistive sense. In these cases, electrostatic excitation is achieved using force generated by applying small alternating voltages to stimulate the microbeam. Sensing of the microbeam flexure is achieved using strain sensitive resistive elements. Oscillatory behavior requires electronic amplification and phase correction circuitry. The approach disclosed herein uses optical methods to drive the microbeam, sense the microbeam vibrations and, if certain conditions are met, produce self-oscillation with no intervening electro-optical components, thus eliminating the need for piezoresistors, drive electrodes, electrical contacts and any metallurgy for electrical interconnection. The resulting simplification in microbeam construction reduces processing steps, eliminates sources of aging or degradation, allows for better matching between microbeams and allows for significantly thinner microbeams for increased sensitivity while reducing chip size and cost.

For background or construction techniques useful in building structures similar to what is described here, see POLYSILICON RESONANT MICROBEAM TECHNOLOGY FOR HIGH PERFORMANCE SENSOR APPLICATIONS by Gückel, et al, 0-7803-0456-X/92, (© 1990, IEEE).

In general the device herein has two potential basic forms: a device having a self-resonating member, drivable by either a continuous or pulsed/modulated optical signal; and a device with a flexible member which is driven to resonance by an optical signal of timed pulses. In general, either one affects an optical input at a rhythm related directly to the vibrations the member makes, since the moving member's reflectivity is changing cyclically with each oscillation. (A third form is also described which uses a reverse biased p-n junction photodiode that only resonates in the presence of light. This third form has significant advantages and disadvantages as well.)

These vibrations of the flexible member and their rates are affected by the other environmental influences on the resonating member, for examples; stress and strain, temperature, pressure, acceleration, acoustic influences, and so forth. Variations in the structure of the member may be made to get better signal-to-noise ratio for the influence being measured, so, for example, a short cantilevered beam would be better for temperature sensing and a relatively long beam attached at the two longitudinal ends would be better for sensing strain. Multi-beam devices are also useful. A number of variations are taught herein.

Accordingly, many real sensing needs may be easily met using this invention, including, for example, pressure, weight, temperature and so forth. Further, these devices may be added to larger structures, such as a larger diaphragm, for example, to calibrate it or give more exact readings than would otherwise be available by direct measurement of a larger diaphragm using capacitive, resistive or other sense originated signals.

Many variations in the structure itself are possible while staying within the scope of the teachings of this patent, and are covered by the claims herein.

SUMMARY OF THE INVENTION

The most simple form requires merely that a resonant microstructure member of one electrical type (p or n) be formed over a wafer, this member extending substantially or fully over a cavity or other space in the wafer. At a location in a wall or floor of the cavity is a region of opposite type (p or n) material. The interface between the two types is known as a p-n junction and is the best known form of a photovoltaic structure. The location of this photovoltaic structure is important. The flexible member and the opposite type region should be substantially in the path of the driving radiant energy (hereinafter called "light" for short). In another version of the invention, the driving light may fall on a region of the same type as the member if that region is coextensive electrically with said member and the member is located across a cavity or spaced apart from an oppositely typed region. The photovoltaic device in the base can also be formed by methods other than a p-n junction. These include a p-i-n diode, a metal-semiconductor junction or surface states which cause the surface potential to be different from the bulk. Such surface states can result in a partially depleted, fully depleted, or inverted surface layers. All these structures can exhibit photovoltaic effects sufficient to drive the flexible member. Herein references to "opposite type" material or regions refers to any photovoltaic structure. The location of the photovoltaic structure is important.

An analogy of the motion of the member might be made to that of pushing a baby on a swing; one pushes when the swing has begun its downward motion. In other words, the driving force to maintain the oscillation must be in the same direction or in phase with the velocity. To complete this analogy, the driving voltage attracting the member is maximum when the member is moving toward that oppositely typed region.

The devices of this invention act as opto-electro-mechanically coupled photodiodes-causing the movable or flexible member to be attracted electrostatically to the opposite type region by the incident driving light. Thus, it couples the optical energy to mechanical resonance or motion through the electrostatic force generated by the photodiode. We disclose herein what we believe to be the reasons it operates the way it does, however, other physical theories may eventually show its cause of operation to be different. Nevertheless, no one has taught a device structure that directly couples optical energy electrostatically to mechanical energy in any similar manner before. Furthermore, the close proximity of the flexible member to the substrate or to an integrated cover or top cap forms a Fabry-Perot interferometer capable of producing large intensity modulations of the reflected light with small displacements of the member. To re-emphasize, to the best of the inventors' knowledge, no one has ever taught a device structure which directly couples optical energy electrostatically into mechanical energy in any manner similar to this instant invention before.

A preferred form would have the vibratory member located within an evacuated capsule. The top cap would seal the member off on one side, and the wafer on which it was mounted or formed would seal the other. A currently preferred form would have the light be incident normal to the member, with the opposite type region positioned to be directly in that light path beneath the member. Evacuated and encapsulated forms are preferred. However, nonevacuated forms and other less than optimal constructions are useful and acceptable for devices, for example, where a pulsed or modulated light signal is used to drive the flexible member and where self-resonance is not necessary or desirable for the use to which this invention is to be put.

The optical pathway may also be at an angle to a covering and be reflected through the resonant member to an appropriately positioned opposite type region.

Variant forms having leaky cavities of various shapes, or flaps, or hinged coverings of holes in the members may be used for pumping fluids. Other variant forms having multiple flexible members, members of various shapes and multiplicities of opposite type regions can be built. This invention could, for example, be used to drive a microencapsulated tuning fork.

In its presently most preferred form the thickness of the flexible member should be an odd multiple of one quarter the wave length of the driving light, and the cavity or space between it and the region of the opposite type should be somewhat less than a multiple of half the wavelength of the incident light. The cavity above the flexible member and the vacuum enclosing shell should be somewhat greater than one-half a wavelength. The flexible member vibrates between its preferred extreme positions at $\lambda/2$ and $\lambda/4$. (Note that any of the distances can always vary by adding or subtracting $\lambda/2$ or multiples thereof since the reflections will have the same phase relationships.)

If a cap is used on the side of the member opposite the opposite typed region, it should be spaced so that the sum of the cavity spaces on both sides of the vibrating member are an even multiple of one-half wave length.

In its presently most preferred form, as a strain transducer, the flexible member is a beam, clamped at both ends, with the photovoltaic device under the beam. A reference transducer responsive to temperature would use a beam clamped only at one end. The thickness of the microbeam and of the spaces above and below it should be chosen so that the light transmitted to the photovoltaic device increases when the beam is deflected away from the photovoltaic device (or area of opposite type), and decreases when the beam is deflected by its own restoring force toward the opposite type area. Since the electrostatic force between the drive electrode and the flexible member increases with light intensity this arrangement results in positive feedback condition useful for self-resonant behavior. This "positive feedback" is perhaps better explained with reference to the figures later.

This implies a photovoltaic device which can develop drive voltage under sufficient illumination to make this a dynamic device, i.e., the rest position of the beam is unstable and it begins to resonate. Thus, this invention describes a member of the class of so called "active devices."

Even in cases where the member/cavity/cap/opposite-type-region arrangement is not in the most preferred spacing configuration, a pulsed or modulated light source can be used to drive the member into a resonant oscillation related to the timing of the driving light pulses. A modulation in the signal derived from light reflected from the surface of the member will be caused by environmental changes (strain, temperature, etc. ) affecting the flexible member's resonant frequency. Long members or beams exhibit other characteristics of vibratory movement that can also be used. For reading frequency, there are at least four methods: self resonance, a phase-locked-loop which makes the modulating driving light synchronous with the resonant frequency, "ring down" of the peaks of reflected light signal returned by reflection from the surface of the flexing member, and frequency scanning wherein the modulation frequency of the driving light is scanned.

The presently preferred way of receiving the reflected light is through the same optical pathway that delivers it. The reflected light path (preferably an optical fiber or an integrated waveguide) has a beam splitter(preferably a 3db fiber optic coupler) that will divert the reflected light to a photodetector and a signal representing the motion of the member in vibration will result, corresponding to a minimum signal at the point where the member is farthest to the opposite type region and a full signal as it travels to a point nearest the region. This beam splitter can be in the fiber optic cable, which may be set in guides on the same chip as the resonant device, although other wave guide structures may be used. A figure describing a similar optical system is in the Kozel, et al article of September 1990, cited above. Integrated silicon-nitride waveguides can also be used as a preferred technique to transmit the incident radiation to the shell and reflect it downwards through the shell and beam and into the photovoltaic device or region. The same waveguide would carry the return light.

Flexible member resonance has been studied with respect to beam-shaped members. See for example Zook, et al, "Characteristics of Polysilicon Resonant Microbeams", © El Sevier Sequoia, 1992. Sensors and Actuators A, 35 (1992)

51–59, which describes the characteristic resonant frequencies, including multiple resonance frequencies. While it is convenient to use the term 'microbeam' to describe the resonant member, the invention is not limited to beam-shaped members only. In this description, the term 'beam' will be used only to refer to a beam of light, in order to avoid confusion.

Devices using the claimed invention can be used for example to measure the speed of a rotating shaft where they are placed in association therewith such that light strikes them only some limited number of times (for example one) per rotation, since the resonant frequencies of the member are much higher than the rotation rate of the shaft.

Such devices can also be used to measure temperature, pressure, strain, force, acceleration, or as timers, where they are isolated from such disturbances. They can be used as microphones, hydrophones, light modulators, and acoustic emission devices. Numerous member/cavity/opposite-type region configurations are possible with currently available technology and the drawings herein can represent only a few.

Devices built in accord with this teaching have the obvious and significant advantages of low power, high noise immunity, high signal to noise ratio, digital-optical output, no metalization required on the chip, and the ability of self-resonance in certain preferred forms. They can also be used as magnetic field sensors, amplifiers, mixers, filters, and corrosion sensors. Furthermore, when coupled with a dissimilar material in a bimorph configuration, they can be used to measure magnetic fields, electric fields, humidity, temperature, chemical adsorption or as proximity sensors.

It should be appreciated that although a p-n junction photodiode provides the easiest visualization of the device operation and is explicated throughout this teaching, any physical mechanism which generates a photovoltage such as a p-i-n junction, a metal-semiconductor junction or partially depleted, fully depleted or inverted surface states would suffice. The preferred construction material is currently silicon, single crystal or polycrystalline, although particularly useful applications may be had from structures constructed of SiC, Diamond, GaAs, AlGaN, GaN, or GaAlAs, or other Ill-V, or II-VI compounds. These materials are preferred because they share properties that allow operation at elevated temperatures. For high temperature applications it would be advantageous to use a wide-bandgap semiconductor such as GaN, which has piezoelectric properties and a bulk photovoltaic effect which can be used at high temperatures. It appears currently to be of great advantage not to require metalization anywhere on the chip, however, some metalization is possible and for some situations may be useful and desirable.

All that is required is construction materials having a sufficiently high-Q and large enough index of refraction to give an adequate change in reflection of the structure at the sense wavelength when the member vibrates.

BRIEF DESCRIPTION OF THE DRAWINGS

FIGS. 2a, 2b, 2c and 2d are line graphs illustrating the rise and fall with respect to time of the member displacement (2a), velocity(and the negative of the frictional force) (2b), the transmitted light intensity reaching the oppositely typed region and restoring force (2c), and the amount of electrostatic drive force on the beam (2d), respectively.

FIG. 3b is a heuristic diagram representation of FIG. 3a.

FIGS. 4a, 4b and 4c are cross-sectional side views illustrating both one preferred embodiment of the invention, and the concept of optothermal drive. FIG. 4d illustrates a variation having two oppositely typed regions.

FIGS. 5a, 5b and 5c are cross-sectional side views of alternate preferred embodiments.

FIGS. 6a, 6b, 6c, 6d, and 6e and 6f and 6g are heuristic diagrams of applications of this invention associated with an accelerometer, and two pressure sensors, respectively, each shown in cut-away side view.

FIGS. 11a and 11b are top and cut-away side views of another preferred embodiment.

FIG. 12 is a line graph of gap spacing versus reflectivity for three variant forms of preferred embodiments.

DETAILED DESCRIPTION OF THE PREFERRED EMBODIMENT

General concept

Figure 1A:
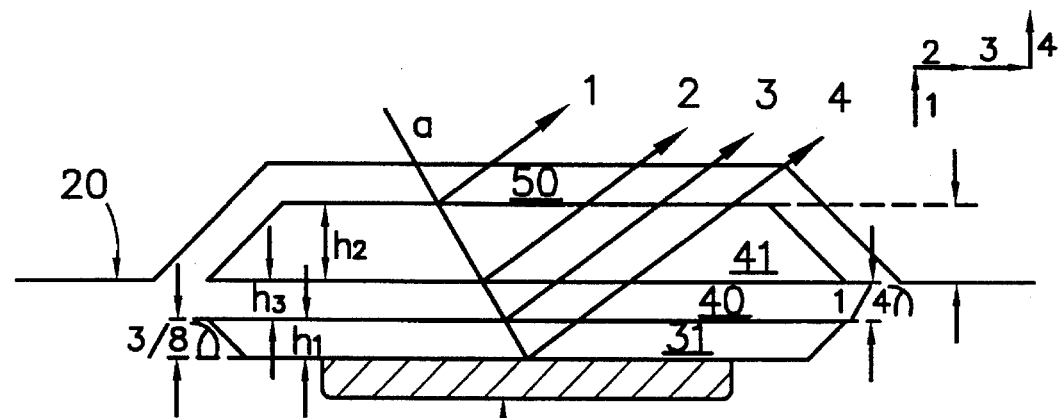
FIGS. 1a, 1b, and 1c are sectional views through the upper portion of a wafer containing a device constructed in accord with one preferred embodiment of the invention; each illustrating a different moment in the oscillatory movement of the flexible member thereof.

Refer first to FIGS. 1a, b and c in which a basic version of the device 10 capable of exhibiting the self-resonant qualities is described. The structure functions as an optical interference filter that modulates the driving light striking the photovoltaic device in the base. The device is formed on the surface (called an upper surface for convenience herein) 20 having, in the preferred embodiment, the ordinary electrical property type (n-type) forming all of the device except for an p-type region 30 at the base of a cavity 31 that separates the flexible member 40 from the area in which the opposite typed region 30 is located. (For some user's applications a device constructed from the reverse order of material types may be preferable but for heuristic purposes we will stick to this arrangement. For this and other reasons it should also be noted that the theory of operation described herein should not be taken as limiting in any way. Only the claims limit the scope of protection afforded this invention.)

The p-n junction functions as a photovoltaic device, generating a voltage between the n- and p- regions in response to incident driving light. (In the nonself-resonant mode of operation(although this may be used for self resonant devices too), the driving light is modulated, and a separate unmodulated beam with a different wavelength or direction is preferably used for reading, although the reflections of the driving light may also be used as well as piezoresistive strips on the beam or capacitive or magnetic sense of the beam position.) Another part of the cavity 41 separates the member from an outer, or top, cap layer 50. Optical input energy (or driving "light") is referred to here by the arrow (a) which strikes the device at an orientation which may be but need not be normal to the surface of the wafer 20, the flexible member (or beam) 40, and the cap 50.

Figure 1B:
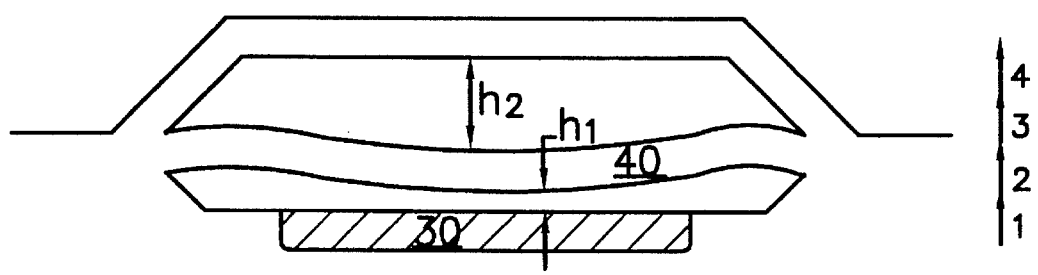

In FIG. 1a the device 10 is at rest with the beam 40 in a low energy or static equilibrium position. The arrival of light striking the region of opposite type 30 causes charge to build up there, creating an electrostatic attraction to the beam or flexible member 40, causing it to flex toward region 30. The extension of member 40 toward region 30, in accord with this embodiment, is illustrated in FIG. 1b. (It should be noted that it is preferred that the maximum extension of the beam downward not reach the lower surface of the cavity.) In order to illustrate the presently most preferred form, refer to FIGS. 1. Note that the device in a FIG. 1a state has a set of measurements where $h_1$ is some multiple of $3\lambda/8$, of $h_2$ is $5\lambda/8$, and the measure of $h_3$ is $\lambda/4n$, where n is the refractive index of the semiconductor of which it is formed. (It is well understood that adding thicknesses to $h_1$, $h_2$, or $h_3$ in multiples of ½ the wavelength of the light does not affect the interference and therefore any such multiple may be used in the completed product without affecting the functioning of the device.)

Figure 1C:
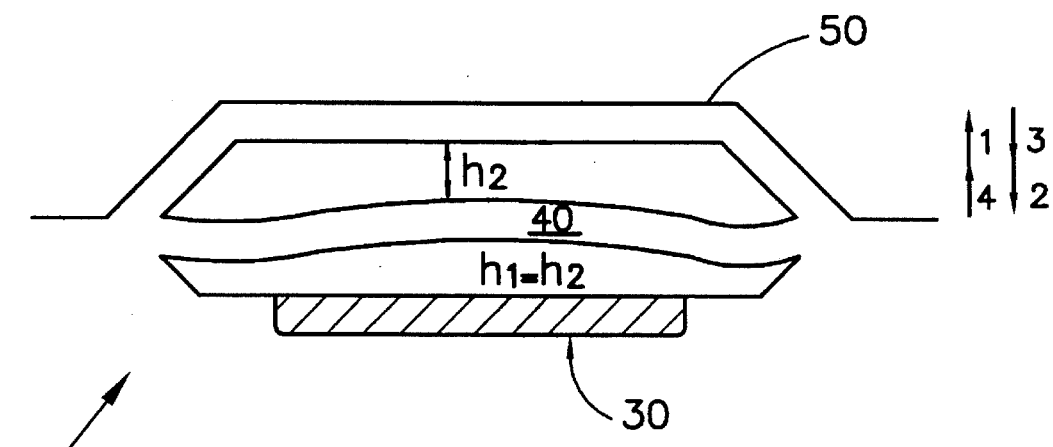

The device in FIG. 1c forms a "quarter-wave stack", the first cavity (31) (height $h_1$), being $\lambda/4$ (or an odd multiple thereof), the beam itself ($h_3$) being also an odd multiple of $\lambda/4$, the upper cavity 41 ($h_2$) being another odd multiple of $\lambda/4$ in width and the cap 50 also the same, an odd multiple of $\lambda/4$ in width. Such a stack is known to effectively reflect light of wavelength $\lambda$. The cap may also or alternatively be covered with an antireflective coating so that reflection from it can be near zero and therefore ignored. Thus, the photocurrent induced in the p-n junction is a minimum at this position. The reflected components (1, 2, 3, and 4) are shown at the right of FIGS. 1a, 1b and 1c. In FIG. 1b, the internally reflected beams all have the same phase, thus their phasors add, and reflectivity is a maximum.

As the beam 40 approaches its maximum extension toward area 30, the potential energy builds. The beam reaches a point where the restoring force overcomes the electrostatic pull and it springs toward the position shown in FIG. 1c. In FIG. 1c, the reflected beams (arrows 1 and 2) cancel because the surfaces are separated by $\lambda/2$. Reflected beams (arrows 3 and 4) also cancel because the cavity $h_1$ is one half wavelength thick (or some odd multiple thereof). Thus, beam 2 travels a full wavelength further than does beam 1. The two beams cancel because beam 1, reflecting from a less dense medium, does not change phase upon reflection. Beam 2 does change phase by 180° upon reflection from a more dense medium. The same phase change arguments applied to beams 3 and 4 account for their cancellation. In summary, the reflected light is a minimum, and thus the transmitted light in FIG. 1b is a maximum, generating a maximum in the photodiode current.

Thus is described the oscillating cycle of bridge beams, plates, extremely narrow beams, cantilevered beams, and similar flexible structures. Where the Q values and indices of refraction permit it, the cyclic resonance will occur without pulsing or modulating the light that drives the beam. It must be recognized that even without this self-resonance, one can set the timing of pulses or modulations of incident light to drive the member through the resultant electrostatic attractive force. In all such devices the rate of pulsing of the driving light will cause a related cyclic vibratory motion to be set up, which describes the movement of the beam, and thus describes the expected optical output of reflections of a reading light trained on the beam. The member can be driven through direct electrical means, magnetic means or other means as well, but optical drive is preferred. The device shown in FIG. 1 has unique properties that make it useful as a narrow band selective optical modulator useful for detecting mechanical motion of the supports even when a photovoltaic structure is not present. By properly choosing the thicknesses of the cavity and the microbeam for a given wavelength and angle of incidence, the structure is made highly sensitive to the motion of the microbeam as illustrated in FIG. 12. Thus, small motions of the supports will start the microbeam vibrating, thereby modulating the reflected light. Two useful examples include an acoustic emission monitor and a piezoelectric filter.

When the resonant microstructure and associated optical components are attached to, or a part of, a larger structure, it functions as a monitor for acoustic emissions in the larger structure. A sharp acoustic impulse produced by a fissure or crack, for example, will produce a characteristic "ringdown" behavior that causes modulation of light at the resonant frequency which lasts for a time much longer than the original acoustic impulse, thereby facilitating detection of the event through monitoring of the intensity of reflected light.

Piezoelectric excitation can be used in place of optical excitation to drive the microbeam and thereby modulate reflected light. We have found that this configuration is a very effective means of testing resonant structures at the wafer level, by using a piezoelectric transducer to excite the entire wafer. Light from a low-power laser is focused on the device under test and reflected light is picked up by a 1 mm diameter multimode optical fiber which is coupled to a photodetector. A few millivolts applied to the piezoelectric polymer film transducer under the wafer is sufficient to drive the microbeam to resonance, where the drive voltages equal to one of the resonant frequencies of the microbeam. Thus, the piezoelectrically-driven structure acts as a narrow band filter which allows signals very close to the resonant frequency to be detected as modulated light. Whereas signals of other frequencies are reduced in magnitude by a factor of Q. An array of such microresonators on the same chip, each having a different resonant frequency, will all be excited by the same piezoelectric transducer and could be used to separate frequency multiplexed signals. The individual microsensors can be addressed by an optical waveguide fabricated on the same chip that would route the signals to different sensors.

It should be recognized that the features in FIGS. 1a, b, and c are exaggerated for illustrative purposes and should not be considered in limiting the scope of this invention.

In FIGS. 2a, 2b, 2c and 2d, the displacement with respect to time of the member toward the substrate (2a), the velocity and frictional force on the beam (2b), the fractional light intensity reaching the oppositely typed region (2c) and the amount of electrostatic drive force on the beam (2d), are illustrated as lines 61, 62, 63 and 64, respectively. Together these describe the phase relationships for self-resonant photodiodes. They also can be used to describe the relationships of any of the opto-electro-mechanical couplers which will exhibit similar relationships between the timing of the peaks and fractional light intensity reaching the area under the flexing member; the diode (FIG. 2c) and a peak beam or member position; as well as the relationship between the beam or member position (FIG. 2a) and the electrostatic drive forces Vd (FIG. 2d) which is available to influence the beam. Certain structures may skew these relationships somewhat, however, the preferred embodiment relationships will be similar to those described in these graphs. It should be noted that the largest value of x (FIG. 2a) corresponds to FIG. 1b and the most negative to FIG. 1c.

In general, displacement is represented by x according to the relationship: $x=x_1 \sin \omega t$, indicating that it is opposite to the restoring force and acceleration, or ($m\ddot{x}=-kx$, m, k>0).

The velocity is the derivative of the displacement.

The light intensity reaching the photodiode is a function of the varying reflectivities of the system. The diode current is defined as $i_p=\beta x$, where $\beta$ is a real number (i.e., no phase lag), chosen to be negative ($\beta<0$) as shown in FIG. 2c for positive feedback.

The drive voltage, or $V_d$ is determined by the load impedance, $Z_L$. The important term is the imaginary part of the voltage ($V_d$), that is, the voltage component that lags the current as shown in FIG. 2d because of diode capacitance. Thus, the electrostatic force on the beam, which is proportional to $V_d$ is in phase with, and in the same direction as the velocity. This phase relationship insures that electrical energy is supplied to the beam to maintain the oscillatory motion.

The total driving force is proportional to the square of the charge $q_1$ on the drive capacitor: $q_1=C_d V_d$, and therefore the force, $$F = \frac{q_1^2}{2e_o A}.$$

It should be noted that the amplitude of vibration in the preferred embodiment is up to ⅛ the wavelength $\lambda$ of incident light. The reflectance at each inner surface is 33% and the index of refraction n=3.7 (for Silicon). Other high Q materials having high reflectance and high index of refraction may also be used.

It may be useful to refer to FIG. 12 here to complete the explanation of the member movement. The transmission is shown as a function of the gap spacing between the bottom of the flexible member and the top of the cavity beneath it (in which surface is the oppositely typed region from the type of the member). The highest points on the curves represent the maximum light transmission and the minimum points on these curves represent minimum transmission of light, through the beam. These lines a, b, and c represent the gap spacing for polysilicon resonant beam members having no top cap or shell(a), a shell with an antireflective coating(b) and a shell with no antireflective coating(c). The small index case described above for pedagogical purposes gives a cosine curve (not shown). The preferred embodiment operates in the region of positive feedback 105. The region of negative feedback is area 104. Therefore the most preferred region 102 is where the slope is most nearly vertical, or steepest, for each curve. The points of equilibrium (x=0) with light 100 and without light 101 are also indicated. The light established a dc voltage on the photovoltaic device that draws the flexible member closer to the substrate. In this figure, the positive direction of x is to the left, as indicated on curved.

Figure 3A:
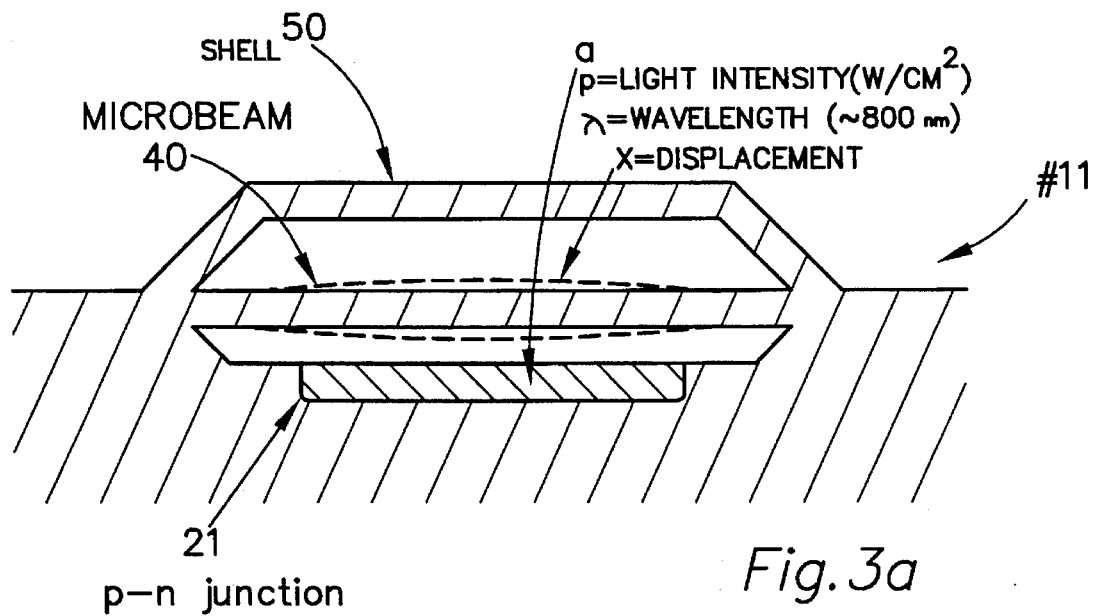
FIG. 3a is a cross-sectional side view of one preferred embodiment.

Because the concepts described herein are different from those described in prior art, further illustration through a heuristic model is also included here. Accordingly, please refer to FIG. 3a and FIG. 3b in which the device 11 is shown again in cross section in FIG. 3a and wherein the displacement of the beam x is illustrated by dotted lines both above and below the at rest position of the beam 40. Here also the p-n junction 21 is pointed out.

Figure 3B:
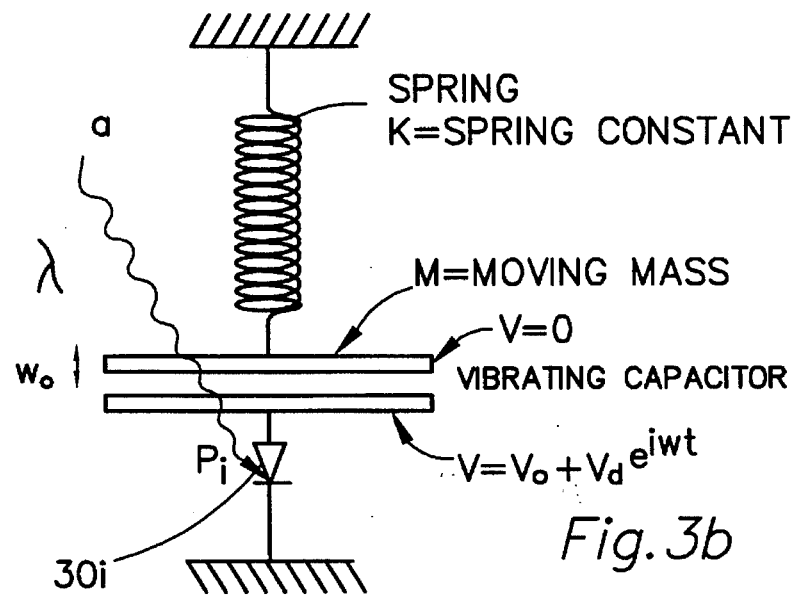

FIG. 3b illustrates a heuristic model of the inventive device 11. Physically it has a spring S with a spring constant K suspending a moving mass M (the beam or flexible member is both K and M) in a vibrating capacitor (the capacitor plates being M and R). The capacitive relationship is between one member and either the material beneath the flexible member or the cap above it, or both, illustrated here as element R. The light beam "a" (of wavelength $\lambda$ and power $P_i$) strikes the photodiode 30. It is believed that the relevant equation of motion is expressed by a formula which is commonly used in physics texts describing mechanical oscillation:

$$\ddot{x} + \frac{\omega_o}{Q} \dot{x} + \omega_o^2 x = \frac{F}{M,}$$

where $\omega_o$ is the angular frequency(radians/second), Q is the quality factor of the resonance, F is the external force required to maintain the oscillation and M is the effective mass of the vibrating member.

The electrostatic drive force equation is believed to be:

$$F=F_0+F_\omega e^{i\omega t}.$$

The photo-induced current is proportional to the light intensity and may also be given by equation:

$$I_s(E^q e^{V/kT}-1),$$

where $I_s$ is the diode saturation current, $q_e$ is the electron charge, k is the Boltzman's constant and T is the absolute temperature.

The dc bias voltage equation should be obtained by solving the equation for V:

$$V = \frac{kT}{q_e} \ln(I_p/I_s + 1),$$

The ac drive voltage is given by the ac impedance of the photovoltaic structure at the resonant frequency multiplied by the ac component of the photogenerated current. This ac impedance has a real part due to electrical resistance, and an imaginary part due to capacitance. The capacitive component is the component that is effective in driving the microbeam, as illustrated in FIG. 2d. Or, mathematically, $V_d$=kT/$q_e$*sq. root(1+jwt), where t=is the minority carrier lifetime, which may be optimized to be the lowest threshold for self oscillation.

Figure 3C:
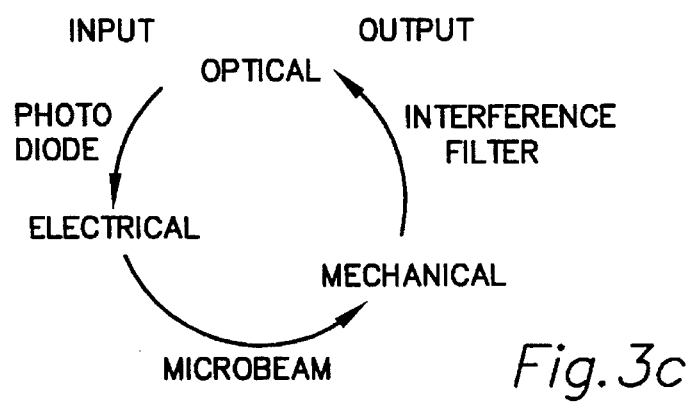
FIG. 3c is a heuristic energy conversion cycle diagram.

FIG. 3c illustrates briefly the exchange of energies accomplished by this device among the separate components. The photodiode, resonator, and interference filter are well known and could be assembled to make a self-resonant device similar to the device described in the paper by Jones, Naden and Neat (referenced above). In the present invention these elements are merged into a single structure and are inseparable. An analysis of electrostatic drive requirements for an electrostatically driven flexible member has been described in a published text by Skor, "Vibrating Systems and their equivalent circuits", Elsevier Press, 1991. Devices constructed with the process described in the papers referenced in the summary section of this document have shown Q values as high as 100,000 with drive energy requirements of $10^{-14}$W. (Q is the empirical parameter used to describe the sharpness of the resonance and the ratio of the maximum stored energy to the energy loss per cycle for a vibratory or oscillating member.)

It should be noted (with reference to FIG. 12) that the large index of refraction of silicon (n=3.7) makes reflectivity at each interface high, and multiple reflections make the transmission curve look more like that of a Fabry Perot interference filter. Thus, the amplitude of the vibration can be much less than $\lambda/8$ say $\lambda/20$, for example, and high modulation efficiency should still obtain.

Where the index of refraction is different and the Q is different, results may be better or worse than those described, but similar functionality should obtain as well.

Refer now to FIG. 4a, 4b, and FIG. 4c, in which the device 12 is illustrated in relationship to an optical fiber 13 for a drive and sense mechanism. These figures illustrate how higher order modes than the fundamental can be excited. Also illustrated in these figures is how an opto-thermal driven beam may also produce similar effects in a beam. While a useful device may be constructed using these two drive mechanisms together, we are here combining these two independent and distinct concepts onto one set of figures for succinctness of exposition. It should be noted that substantially more energy would be required to drive an opto-thermal driven sensor of this construction than would be required for the photodiode driven sensor. In the opto-thermal sensor, the drive mechanism consists primarily of an area of absorber material 14 located on the beam 40 which absorbs the radiant energy from the optical fiber 13. It is preferable for the absorber to have a substantially different expansion coefficient than the beam and be thermally isolated from it. In this illustration, the absorber material 14 is located at one end of the beam 40. Absorption of modulated radiation will optothermally drive it into a fundamental mode $f_0$ or its first overtone $f_1$ as shown in FIGS. 4b and 4c, respectively, depending on whether the optical energy is modulated at $f_1$ or $f_0$.

In the opto-electro-mechanical device herein (as opposed to the optothermal drive device just described), the absorber material is not on beam 40 and the light travels through the beam to area 30. By placing this area 30 of opposite typed material beneath the beam 40 but in the substrate 20, the photodiode attracts the beam 40 at the area 30 location, and thus excites fundamental or first overtone modes of vibration as illustrated in FIGS. 4b and 4c. It is assumed in this case that a pulsed/modulated driving beam is used to set up the vibration or vibrations desired either for the opto-thermal drive mechanism and in the drive mechanism using the photodiode of this invention. If the pulses are periodic with the frequency $f_0$ or $f_1$, only the single corresponding mode will be excited. If an abrupt step function pulse is applied (like plucking a musical instrument string) a multiplicity of modes may be excited simultaneously.

(For clarity it must be recognized that area 14 and 30 would not coexist in the preferred inventive device, but that they are illustrated here in the figure so that nearly duplicate sets of drawing are not required.) In a similar fashion, excitation of the torsional mode is achieved by placement of the photodiode away from a centerline bisecting the center of mass of the resonant microbeam.

A good description of numerous modal vibration characteristics of resonant beams is found in the literature in the paper by Zook, et al, entitled, "Characteristics of Poly-Silicon Resident Microbeams" cited above. By using a reading light beam (or more than one reading light beam) trained at different locations on the beam, the various modes can be read out by modulation of the reflected reading beam(s), making use of the optical modulator characteristics of this invention.

FIG. 4d is provided to describe, in a heuristic manner, how the structure could be modified to include a plurality of oppositely typed regions for added flexibility in beam excitation. By varying the timing of incident light beams, reaching different areas 30a, 30b, great flexibility in stimulation may be achieved.

Numerous different forms for the invention described herein can be readily imagined and are considered within the scope of this invention. A few are illustrated as follows. Refer now to FIGS. 5a, 5b, and 5c. In FIG. 5a a basic cantilever drive device can be seen having a cantilever beam member 40c above cavity 31 and oppositely typed area 30 and below cavity 41 and cap 50. This device 13 would, of course, be driven in the same way as described with reference to the previous devices. An input light beam either continuous or pulsed/modulated would pass through the materials in cap 50 and beam 40 and reach oppositely typed area 30 generating electrostatic force through the photodiode effect to start beam 40c vibrating. A slight variation on this theme can be realized with a construction similar to that described in FIG. 5b, device 13a. In this device structure, the beam 40c allows light rays A to be transmitted at an angle striking photodiode 30. At higher angles of incidence, the reflectivity of the surface increases. As in a Fabry-Perot interferometer, higher reflectivity means that the optical finesse is higher, and the conditions for constructive and destructive interference become more critical. Thus the slopes in FIG. 12 become steeper, and the effective gain is increased. The threshold for self-oscillation can thus be decreased, but the tolerances relative to the thickness of the cavities and the microbeam become more critical.

The embodiments described with respect to FIG. 5c are also illustrative, however, of the bridge-type beam bounded or clamped at both ends. As a heuristic device, area 52 is illustrated in dotted lines showing where a cantilever beam may be created out of the bridged beam 40. This, of course, is for illustrative purposes only as once the construction is finished it would be difficult to modify the structure of the beam. As illustrated here also, the top cap 50 is not required for the proper functioning of all embodiments especially those where the self-resonance is not required. Note that if the top cap were missing, no evacuated chamber may be relied upon thus the movement of the beam will be affected by the presence of a fluid above it and below it in cavity 31. If it is desired to measure the effect of this fluid on the resonance of the beam by the change in the environment of the fluid, this construction may be particularly well-suited to such sensing applications. Additional mass loading of the microbeam by selective absorption/desorption on the microbeam surface will cause shifts in the resonant frequency and therefore can be used in chemical sensing applications. Alternatively, the measurement of low pressure is possible with uncapped resonating elements by monitoring the variation in device Q with changes in ambient pressure. For example, a sensor of this configuration detects loss of heremeticity in a previously sealed container. Also illustrated in this FIG. 5c is the fact that the photodiode area of oppositely typed material 30 may be made larger or smaller in size to suit the needs of the user. The portion of the diode extending beyond the flexible beam does not provide a modulated current to drive the beam, however, when illuminated, it can provide an added dc bias voltage. It is believed the drive force is proportional to the product of the ac and dc voltage. Thus, dotted areas 30a and 30b are added to show that in some embodiments which may be preferred, the size and area of the photodiode may be increased.

Figure 6B:
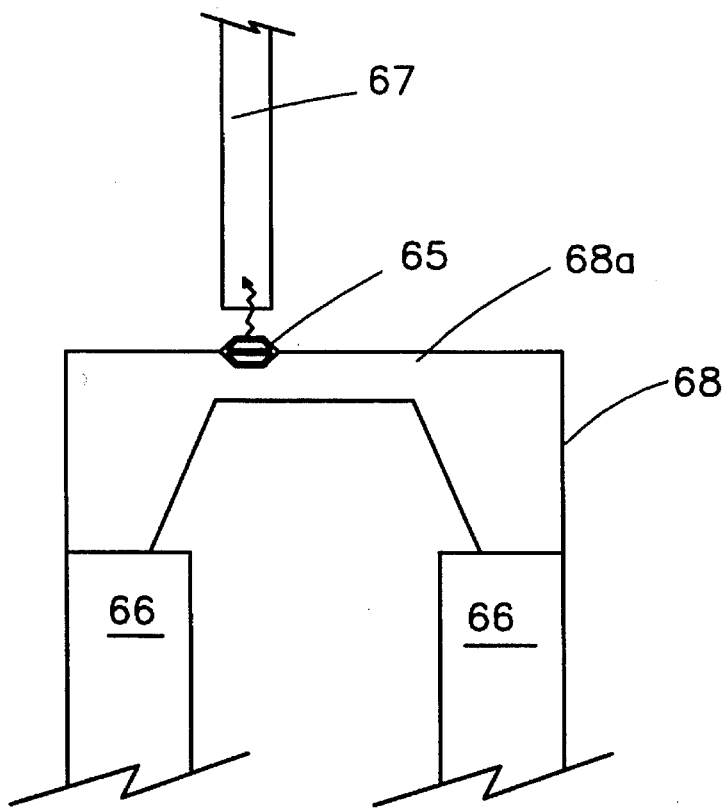
Figure 6C:
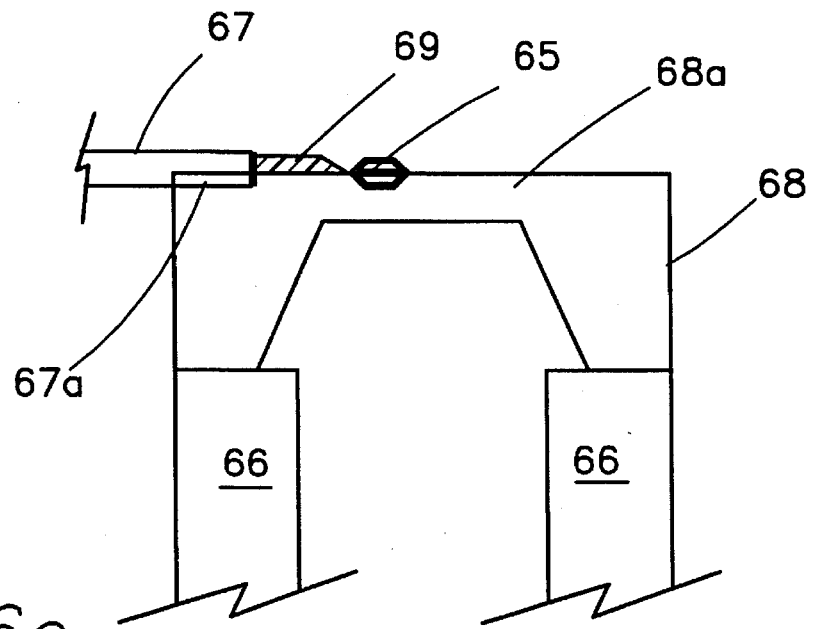

An easily obtainable application for devices constructed according to this invention is described with reference to FIG. 6a in which an accelerometer chip 14 is illustrated having a top stop and damping plate 15, a bottom top and damping plate 16, a proof mass 17 suspended by biplane flexures 18 above and below open spaces 19a and 19b. By placing an optically resonant microbeam constructed in accord with these teachings on one of the biplane flexures 18, the stress induced by movement of the proof mass in the biplane flexures will affect the rate of vibration of the flexible member in the resonant microbeam structure 9. (A double bounded beam form is preferred, oriented so as to be maximally strained by the direction of movement of most importance to the user.) Additional microbeams (not shown) can be strategically positioned for temperature compensation and to allow numerical subtraction and cancellation of first order effects. The drive and sense light may be delivered through a fiber optic cable or channel 7 from a light emitting diode (or laser or other light source) 22 and received by photo detector or interference read out structure 23. Separate delivery/sources/wavelengths may be used to distinguish the read from the drive beams reflections when self-resonance is not used. With a suitable amplifier, the output of photodiode 23 could be fed back to the driver of the light source 22 with the proper phase and adequate amplitude so that the closed loop system will oscillate. Similar closed loop operation is described in the earlier reference by Zook, et. al. FIGS. 6b and 6c illustrate other applications to a pressure diaphragm 68a, shown here mounted to a tube 66 by its integrally formed substrate 68. The resonant device 65 sits at an area of greatest potential for stress in the diaphragm. In both Figs, an optical fiber 67 transmits the light to and from device 65, however in FIG. 6c the fiber is mounted into a "V" groove 67a which is linked by a waveguide 69 to the device 65. For precision applications, additional microbeams (not shown) allow cancellation of first order non-linearities and temperature compensation.

FIGS. 6d and 6e show other forms for accelerometer structures, similar to that of FIG. 6a, that may employ this invention. FIGS. 6f and 6g illustrate an alternative sensor form comprising a strain sensitive flexural member on a thinned cantilevered extension of the substrate. The extension is attached at only one end and is substantially free to bend. A dissimilar material is deposited on the top or backside (illustrated) to form a bimorph or bimaterial strip which is made sensitive to various stimuli by judicious material selection. The cantilevered extension provides effective isolation from package induced stresses and is thinned for increased sensitivity and faster response. A sputtered glass, for example, provides a bimorph sensor sensitive to temperature because of thermal expansion coefficient mismatches. A shift in temperature causes a greater expansion of the glass than the cantilevered extension resulting in bending of the bimorph and consequent shifts in the frequency of the flexural member. Other examples of deposited materials include a humidity sensitive polymer which expands with water uptake for humidity sensing. Species-selective films produce selective chemical sensors. Use of a magnetostrictive film produces a magnetic field sensor for proximity sensing applications. A piezoelectric material produces an electric field sensor. Compensation for temperature effects can be made with a second temperature sensitive microbeam. Alternatively, a second layer can be deposited with a material having a thermal expansion coefficient chosen to compensate for temperature changes.

In its simplest and most efficient forms, this device will produce a digitally compatible pulsed output, with a pulse repetition rate corresponding to the rate of flexing of the beam, and the rate of beam flexing.

Figure 7:
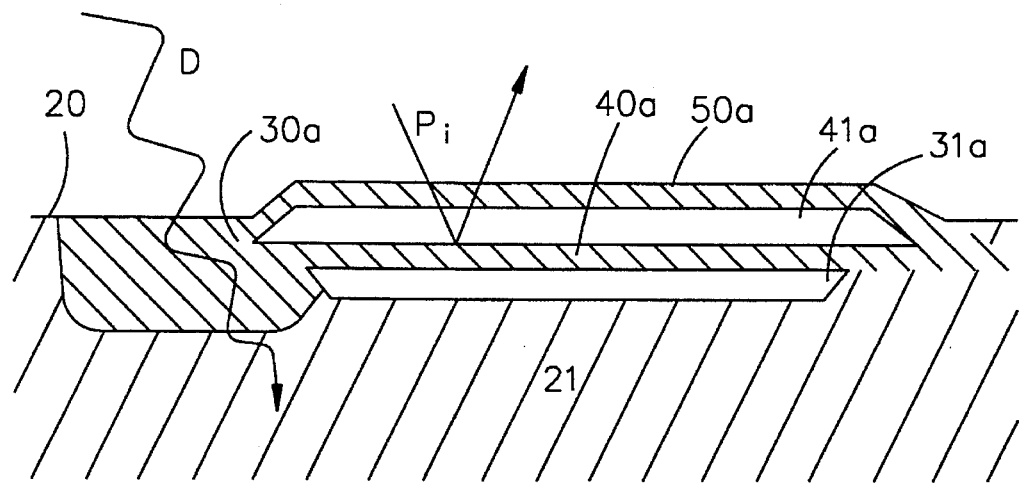
FIG. 7 is a cut-away side view of an alternate preferred embodiment.

FIG. 7 illustrates an alternate embodiment of the invention that is not self-resonant. In it, a modulated driving or excitation beam D strikes p-type area 30a which is formed coextensively with the flexible beam member 40a, and, in this case, with the top cap 50a as well. The build-up of charge in the photodiode junction between 30a and 21 will attract the beam 40a to the wafer 21 and set up the same kind of resonant dynamics described with respect to the other embodiments previously described. A read beam R trained on the movable surface of the member 40a will have in its reflection an indication of that movement, such as with the movement of the other flexible members with respect to the other embodiments previously described.

Figure 10:
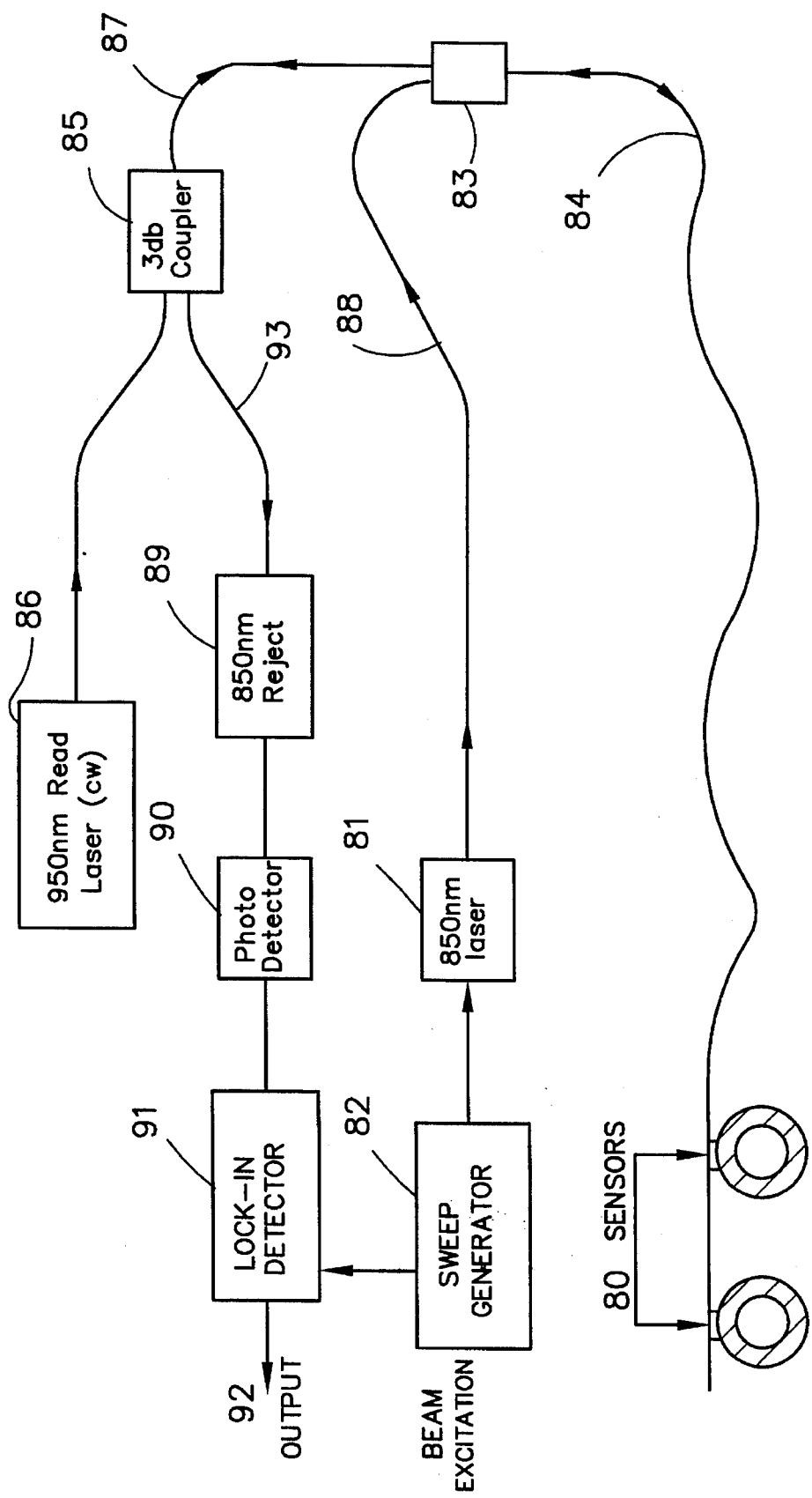
FIG. 10 is a block diagram of a preferred embodiment.

FIG. 10 shows a block diagram system for exciting and reading the output of sensors as described in this patent, for non-self-resonant forms of this device. The sensors 80 are both on an optical fiber 84 which sends and receives in this case laser light of two particular frequencies. The beam excitation laser is a 850 nanometer modulated laser 81. This laser is modulated by the sweep generator 82 to produce appropriate pulse rates on fiber optic cable 88. A separate read beam laser 86 produces an 950 nanometer wavelength continuously. A 3db coupler 85 is used in the path as a beam splitter for separating the reflected light and channeling it to the detector.

The 950 nanometer light from laser 86 also travels down the optical pathway 84 to the sensors 80. As this read beam is reflected by changing rates of vibration of the reflective flexible member in the inventive device, a time varying digital signal is returned along the light path 84. Only the 850 nanometer wavelength gets through the division multiplexor 83 to light path 87 which, through the optical coupler 85, returns the reflective light through the detector pathway 93. A 850 nanometer filter 89 is provided to reject any stray read beam light that has been returned. A photo-detector 90 (which may be of InGaAs, but could be of other varieties, silicon, for example) produces a digital electrical output corresponding to the digital optical signal it receives. A lock-in detector 91, such as a phase-locked loop, can be used to amplify the signal to produce an output 92. Maximum signal is observed for small frequency shifts. It will be easy to identify which frequency corresponds to which sensor, and associate the frequency shift with the proper sensor(e.g. pressure or temperature, etc.). For large frequency shifts, it may be necessary to measure overtone frequencies to sort out the resonances from each sensor.

Figure 8:
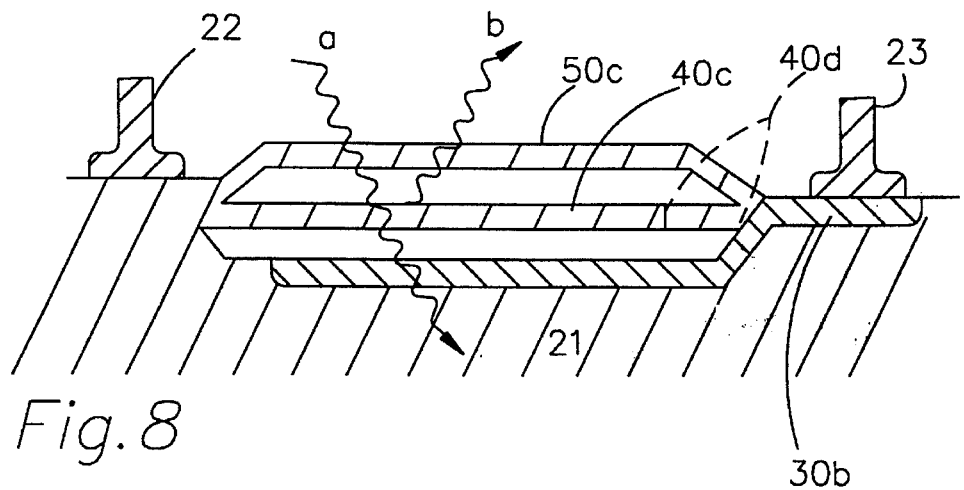
FIG. 8 is a cut-away side view of another alternate preferred embodiment.

In FIG. 8, the flexible member 40c is formed of electrically typed material of the same type as the wafer 21. (The beam shown here could easily be constructed as a cantilevered structure by removing the section indicated by dotted lines 40d). The opposite typed material area 30b extends beyond the edge of the encapsulated region containing the flexible member 40c. An electrical connection 22 is provided to act as a base contact, and another electrical connection 23 is connected to the wafer 21 to provide a reverse bias to the p-n junction. The provision of the reverse bias p-n junction allows for a very small optical excitation to produce sufficient charge to draw the movable member 40c toward the opposite or n-type region. By adjusting the bias voltage, the amount of light in an excitation beam required to produce self-resonance or any beam movement can be adjusted. While numerous problems can be solved using the invention described with respect to FIG. 8, a drawback is the fact that an electrical connection must be established. In some applications, it would be useful to use this device as a light detector with an ac output at a well defined frequency. This makes it immune to other noise sources. The self-resonance provides a built-in chopper for the light.

Another form of the present invention is as an environmental voltage sensor for voltages arising from the environment. A voltage across these contacts adds or subtracts from the photovoltage which drives the microbeam. When the electrodes come in contact with an electrolyte, such as a corrosive solution, a conduction path is established, and an electrochemical potential is generated that affects the device operation. The threshold for oscillation and the threshold for second harmonic generation is affected as well as the frequency of oscillation. Thus, this device could provide a sensitive measurement of corrosion conditions and corrosion potentials in EMI and RFI environments that would otherwise preclude measurement. Use of two different electrode metals on electrodes 22 and 23 generates an EMF, (i.e., a battery) when the sensor is in an aqueous environment. The electrical voltage associated with the EMF has a definite polarity with respect to the internal photovoltaic structure of the sensor and, thus, can increase or decrease the light intensity threshold for oscillation. With appropriate electrode design, it is also possible to make a pH sensor or other ion selective sensors, using the techniques and structures taught herein in view of known art relative to ion selective electrode design and manufacture.

Another preferred form is illustrated in FIGS. 11a and 11b wherein a large region 30 electrically isolates the entire structure 110 from the substrate 111. The cap 50 may be formed of either type of material but here is shown as of the same electrical type as the flexible member 40. If it is formed of undoped polycrystalline silicon, it is electrically neutral, being neither n nor p type, which is also acceptable. As with all embodiments it is the interposition of the flexing member between the source of driving light and the photodiode that causes the useful effects of these devices.

Figure 13:
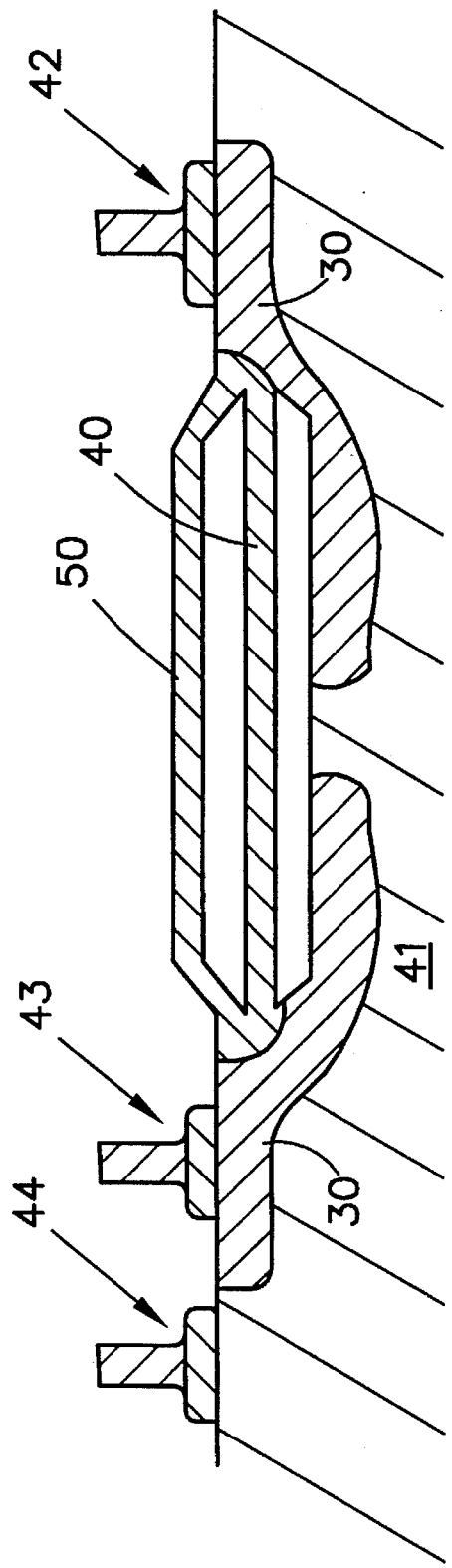
FIG. 13 is a cut-away side view of another preferred embodiment.

The FIG. 13 embodiment is a variation of that of FIG. 8, but having a drive contact 43, a diode contact 42 and a base contact 44. It should be noted with respect to these devices that have metalization (connections to electrical contacts here) that high temperature sensing applications may not be suited to such structures. The metal contacts can be expected to fail at high temperatures and stresses whereas those forms of this invention which have no metalization can survive and function in much more extreme conditions and sensing missions.

FIG. 13 illustrates an embodiment wherein the optical modulation properties of the invention can be used. In this embodiment there are two separate regions 30 and 31 of opposite type material from the base 41 connected to base electrode 44 The beam 40 and cover 50 are also in direct contact (not shown) connection to the base 41. In this structure, the drive voltage can be applied through electrode 43 and the modulation caused by the moving beam can be sensed by the electrode 42. This embodiment configuration allows a large drive voltage and provides a large sense signal which would be most useful in applications where the mechanical Q is low.

A property of the present invention is that it can exhibit modulation gain. This means that, when illuminated by modulated light at the resonant frequency of the beam, the reflected light can have a different modulation index than the incident light. This clearly shows that the device is an "active" device because the reflection of light is otherwise a highly linear process which preserves modulation index. The reflected light can be detected by a photodetector, amplified, and fed back to the modulator of the light incident on the beam. With a gain greater than one, and the correct phase of the feedback signal, such a system will oscillate at the resonant frequency of the beam. As a practical matter, the system will operate only marginally unless the resonant microstructure has significant modulation gain as described above.

The present invention also exhibits conversion gain. As the intensity of the excitation light is increased, the amplitude of vibration of the beam increases. At sufficient amplitudes, a reflectivity maxima or minima (or both) will be reached at the peak of the vibration and the reflected light waveform shown on an oscilloscope will begin to fold over indicating strong second harmonic and even third harmonic generation. This action is evident on a wideband oscilloscope because each cycle of the waveform exhibits mirror symmetry. This highly nonlinear behavior shows that the light—excited—oscillator (LEO) device can be useful as a mixer-oscillator, as is commonly used in the first stage of a superheterodyne receiver. This property could be very useful in detecting vibrations or acoustic emission events (such s those due to crack formation or crack growth) with high sensitivity. The acoustic emission event generates a transverse wave in the structure that excites the microbeam into its resonant motion by moving the beam support(s). This effect can be used to detect acoustic emission by optical means. If the beam is already vibrating near the threshold for second harmonic generation, due to LEO action for example, a receiver tuned to the second harmonic frequency will detect the event with increased sensitivity because of the conversion gain associated with the oscillator/mixer action. The impulse nature of the acoustic emission event would cause a ring-down signature that could also help identify the event.

The efficiency of light coupling between the resonant micro structure and the light source can be improved by judicious design and selection of microbeam dimensions and shape. In particular, the portion of the beam which undergoes the largest amplitude of vibration can be significantly wider than the regions near the supports thereby increasing the size of the target photodiode and accordingly, the signal therefrom. The photovoltaic structure is then fabricated under the wider region. For example, if light is coupled into a clamped-clamped microbeam from a multimode optical fiber with a core diameter of 62.5 microns, it is advantageous to make that region of the microbeam at least 62 microns wide, while the support regions can be narrower, for high mechanical Q. This wider portion cannot be made too wide, because the frequency of the lowest order twisting mode will be lowered for the geometry, which may cause undesirable mode mixing.

Configurations that can provide decreased coupling of the microbeam to the modes of the underlying structure can have significant benefits if more than one microbeam is used on the same structure. In addition, this decreased coupling results in high Q, thereby improving the accuracy of the resonant frequency. If the support points are at the nodal points on the lateral dimension, the center of mass remained fixed during vibration of the microbeam.

Another way in which the photodiode can drive the resonant microbeam is by means of a magnetic force rather than by an electrostatic force. In such embodiments, the photodiode is connected so that the photocurrent flows directly through the microbeam. The photocurrent in the microbeam generates a force in the microbeam according to Ampere's Law that is normal to the surface due to an external magnetic field in the plane of the surface, but perpendicular to the length of the microbeam (in other words, perpendicular to the photocurrent). If the dimensions of the microstructure are chosen correctly, such a device will be self resonant at sufficient light intensity levels and magnetic field intensity levels. Such a device may be used as a proximity sensor which will oscillate only when the magnetic field exceeds a critical value. Simple sensors of this type are widely used in intruder alarm systems in doors and windows and can be used in automobiles and in factory assembly lines to name a few applications.

A simple way to fabricate such a structure is to fabricate a high quality photodiode p-n junction in single crystal base material of the structure in parallel with a low quality p-n junction in the polysilicon microbeam. The low quality p-n junction essentially shod circuits the photodiode with the electrical current flowing in the microbeam as desired.

Figure 15:
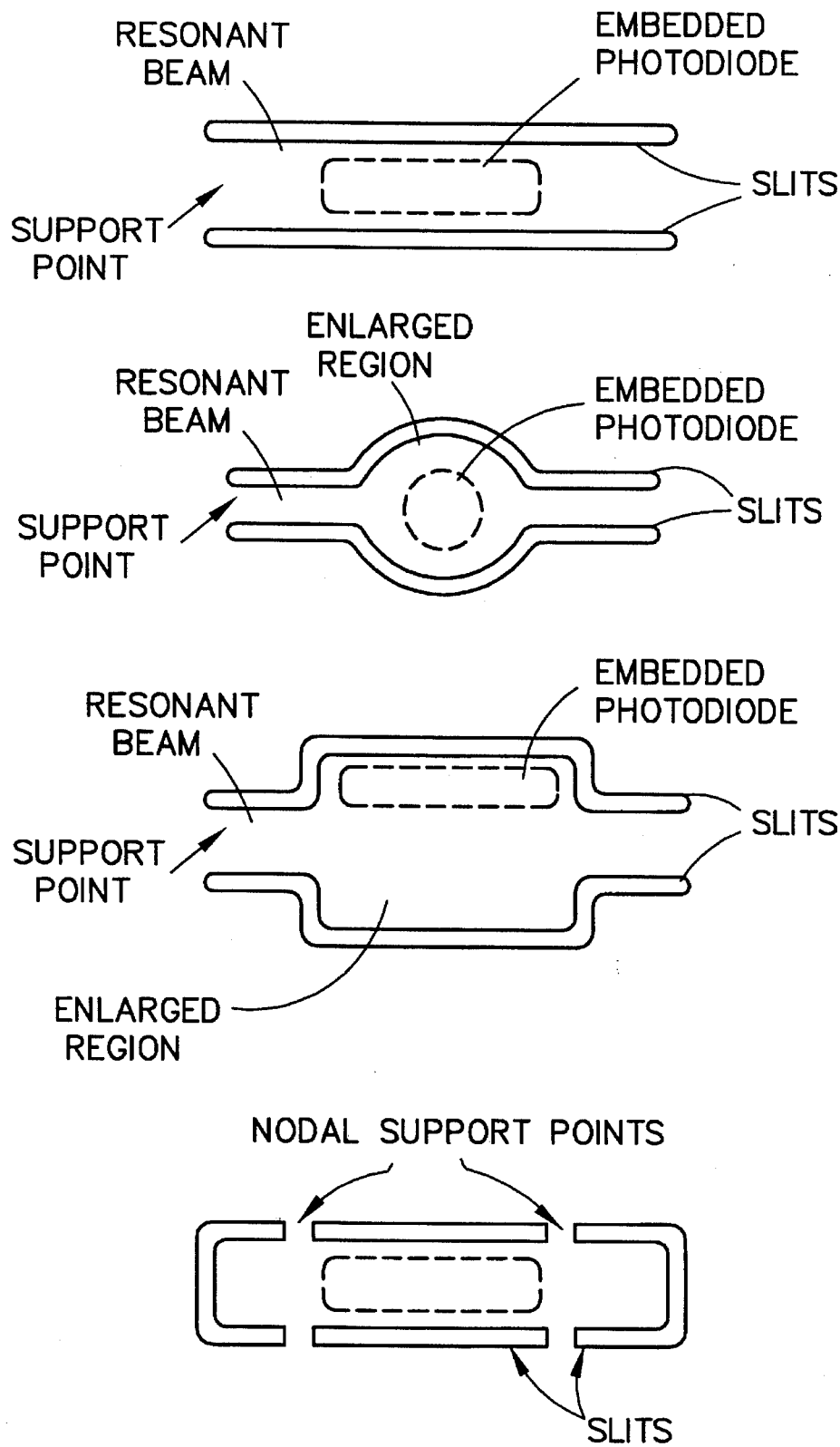
FIG. 15 is a plan view of selected microbeam geometries.

FIG. 15 illustrates several embodiments of a substantially planar flexural member. FIG. 15a shows the top view of a member with a rectangular geometry defined by two long slits. The member is attached at each end to couple applied axial strains into shifts in the resonant frequency. A p-n junction directly beneath the member is shown with a dashed line. A geometry with a wider central section to accommodate a wider tolerance for optical coupling is shown in FIG. 15b. FIG. 15c illustrates a geometry for exciting a torsional mode using one or more underlying photodiode regions located off-center. Additional geometries include, but are not limited to, multiple flexural members placed side by side or one above the other which promise high sensitivity, high mechanical Q and low coupling to parasitic elements. Flexural members that are not attached to the substrate at discrete nodal points on the lateral edges of the microbeam provide these advantages for some applications.

Many other embodiments may be described that fall within the scope of this invention which is limited only by the claims.

Process

In order to build such devices, a particular set of steps may be used, illustrated with respect to the FIG. 9 discussion that follows.

FIGS. 9a–g show the integrated circuit type processing steps which would be used for producing a structure such as one of the preferred embodiments of this invention.

Figure 9A:
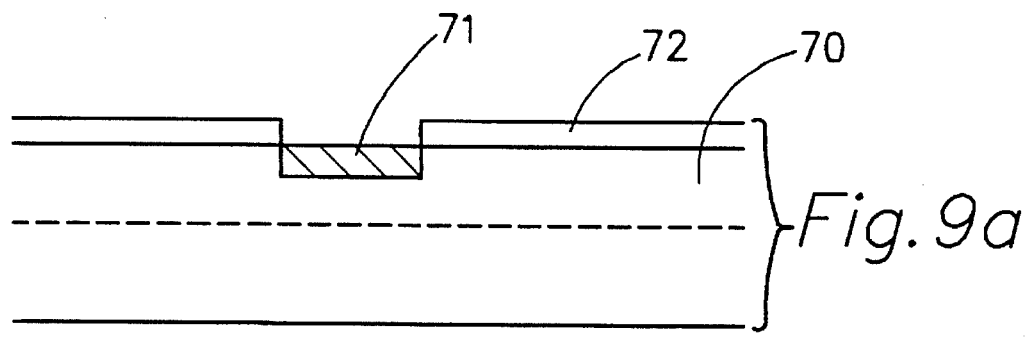
FIGS. 9a–g are side views of a preferred wafer processing series of steps to create one embodiment of the invention.

FIG. 9a illustrates a cross section of a semiconductor substrate 70 after ion implantation using a photoresist and silicon nitride mask 72. The implant is used to create a region of opposite conductively typed silicon, in this case p-type near the surface of an n-type semiconductor wafer or epi (epitaxially grown) layer.

Figure 9B:
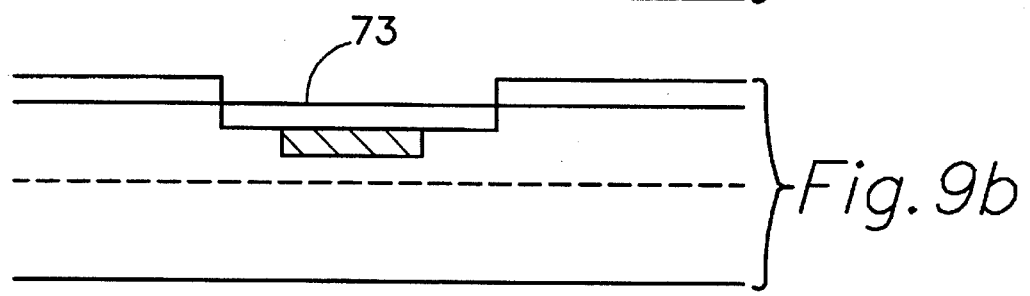

In FIG. 9b the result of a set of selective oxidation steps is illustrated. The nitride 72 is patterned and etched above regions which will form the lower cavity 73. An oxide layer of a thickness about equal to the lower gap thickness is grown thermally, etched back and regrown to result in a nearly planar surface between the lower cavity oxide 73 and the surface of the wafer substrate 70.

Figure 9C:
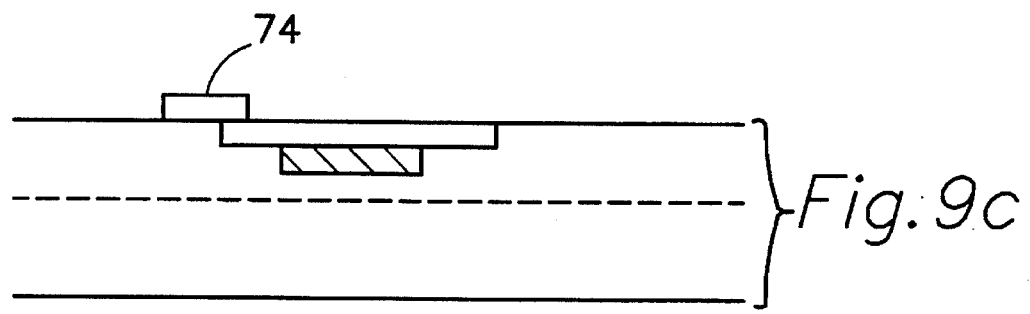

FIG. 9c shows the cross section after channels 74 have been formed. The channels are formed by patterning nitride layer 72 and etching using a selective etchant.

Figure 9D:
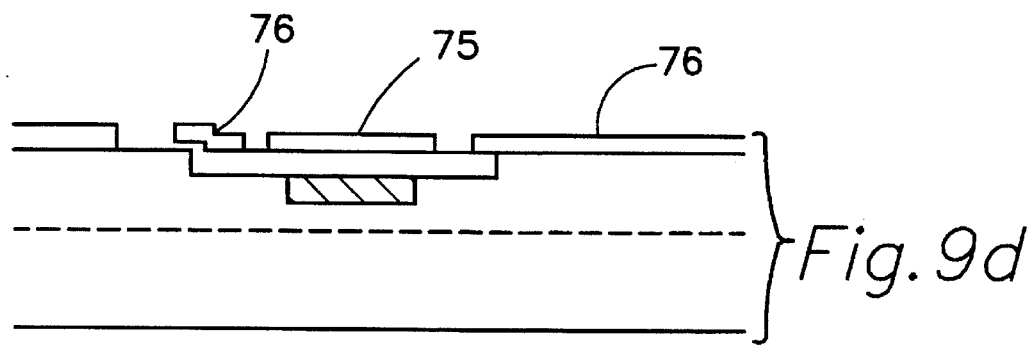

FIG. 9d shows the polycrystalline silicon for the beam structure 75 and the walls of the enclosure 76. Ion implantation of the polysilicon to lightly dope the beam is done at this step in the preferred embodiment. The beam polysilicon is then patterned and etched, resulting in the structure shown in FIG. 9d.

Figure 9E:
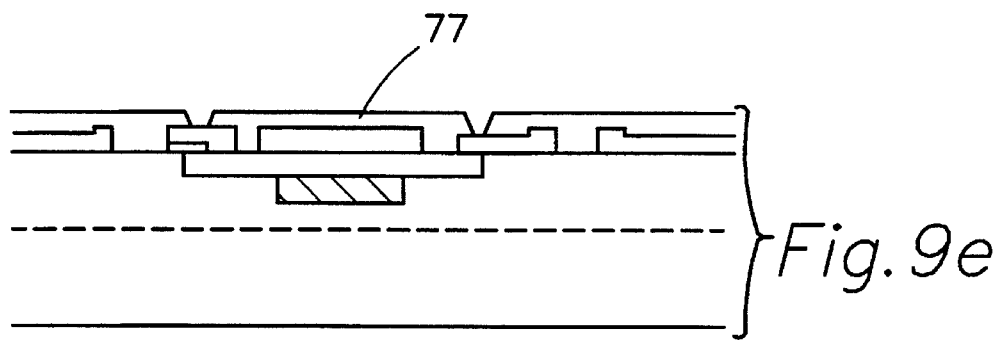

Referring now to FIG. 9e, a Low Temperature Oxide film (LTO) is deposited, patterned and etched to form the upper cavity region 77, the LTO is removed in regions where the shell is to attach to the beam and substrate.

Figure 9F:
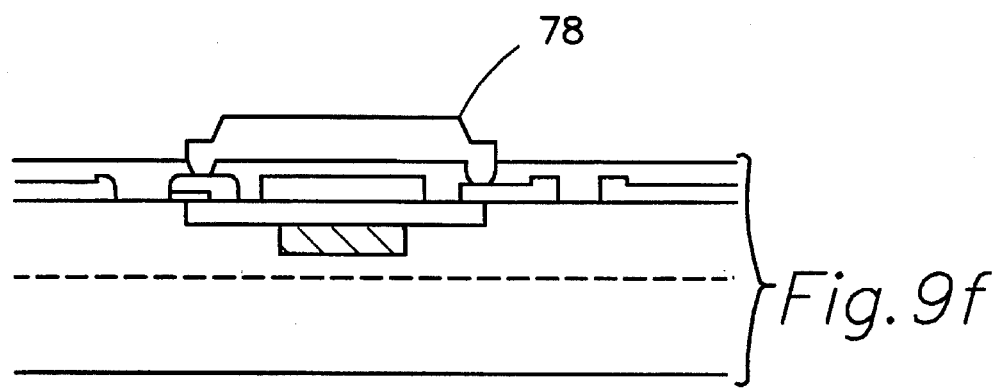

In FIG. 9f, the top of the cavity region or shell 78 is shown. The shell 73 is formed by depositing a second polysilicon layer, implanting, patterning and etching. An anneal is used to activate and drive the implants and to establish a nominal strain field in the beam and shell polysilicon layers.

Figure 9G:
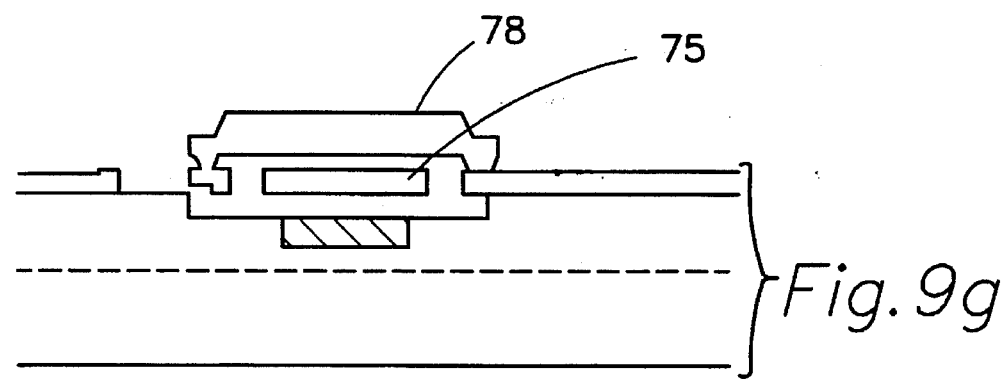

In FIG. 9g, the sacrificial material 74 in the channel region, in the lower cavity region 73, and in the upper cavity region 77 are shown removed using a hydrofluoric acid solution. Regions 73 and 77 together now form a cavity enclosure or capsule around the preferred embodiment microbeam. A thin, sealing layer of low pressure chemical vapor deposited (CVD) polysilicon (not shown) is deposited to create and seal a vacuum in the cavity regions. A final passivation layer of silicon nitride (not shown) may be deposited over the whole surface to enhance the seal and to operate as an antireflective coating.

This process flow reveals the advantageous process reductions for the optical drive/sense resonant microbeams over the electrostatic drive/piezoresistive sense approach. The process flow is useful for either self-resonant or non-self-resonant versions. Self resonant versions require careful selection of the gap and microbeam thickness dimensions, but otherwise are identical to the non-self-resonant approaches.

The number of required masking levels for the resonant microbeam of this invention is reduced to six levels: lower drive, lower cavity, channels, beam, upper cavity and shell. The lower drive level is used to form photovoltaic device will create an electric field due to the photo voltaic effect when stimulated by incident radiation. The applied light may be modulated as in the non-self-resonant approach, or unmodulated of a single wavelength for the self-resonant mode.) The lower cavity mask is required to form the cavity region underneath the microbeam. Implants of material such as boron, or other elements useful for doping, for the electrical connections if needed may also be done through this masking level. The channel layer is used to provide access to the upper and lower cavities for removal of the sacrificial material. The channels are required to be thin for sealing purposes. The beam layer is used to cut the long slits in the beam polycrystalline silicon (in this preferred version) which delineate the microbeams. The upper cavity and shell layers complete the vacuum enclosure for the microbeam. The upper cavity and shell thicknesses are preferably designed for optimum thickness to provide maximum intensity modulation of the sensing radiation (same wavelength and source as the drive light for the self-resonant mode, or of a second wavelength for non-self-resonant modes). Integrated optical waveguides can be formed above the shell later.

Processing of the optically resonant microbeams for this preferred embodiment begins with about a 500A oxidation and about an 800 Å deposition of silicon nitride on a silicon wafer. The wafer may be n-type of p-type, with possible inclusion of an epitaxially grown layer for diaphragm or flexure formation. The nitride is patterned and etched using the lower drive masking level. An implant is made through the oxide with a photoresist mask to form PN junctions in the substrate as shown in FIG. 9a. The next masking layer, lower cavity, forms windows in the nitride for the double oxidation step. An oxide layer of about 4400 Å thick is grown using the nitride as an oxidation barrier. This oxide is stripped in an HF solution and the oxide is regrown to a similar thickness, resulting in a nearly planar surface for the microbeam as shown in FIG. 9b. An oxide trim etch is performed using a dilute hydrofluoric acid etchant to set the lower cavity depth to finer tolerances (3760 Å for 800 nm incident radiation). The nitride is completely removed in a blanket strip, followed by patterning and etching of the etch channels as shown in FIG. 9c. A trim etch to reduce the channel height is performed at this time if needed. The beam polysilicon is deposited next and implanted. The thickness of the beam polysilicon is critical for the self-resonant mode, and is targeted at 4860 Å for an excitation wavelength of 800 nm. It is expected that the beam and shell implants use the same dopant, and of the same dopant as the underlying single crystal substrate or epitaxially grown layer. The beam polysilicon is patterned and etched as shown in FIG. 9d. An LTO layer is deposited conformally over the microbeams. The LTO is patterned with the upper cavity layer and etched to form the upper sacrificial layer as shown in FIG. 9e. A thick shell polysilicon (2.0 um) is deposited and implanted, followed by an anneal at 950° C. to set the strain field and drive the implant. The shell thickness is not critical if an antireflective nitride coating is used to cancel out reflections from the upper shell surface. The shell polysilicon is then patterned and etched using the shell layer as shown in FIG. 9f. The sacrificial etching is done using an HF solution, followed by withdrawal techniques for rinsing and drying the cavity. A 1600 Å layer of polysilicon is deposited to seal in a vacuum and form a reactive seal as in FIG. 9g. A 1040 Å passivation layer of silicon nitride is deposited over the entire wafer, performing an additional function as an anti-reflection coating.

Additional process sequences not detailed in FIG. 9 are required to complete the microstructure for a specific sensor application. A pressure sensor, for example, requires the formation of a diaphragm by local thinning of the substrate. The diaphragm is defined by the thickness of the epi layer and appropriately sized windows in a suitable masking layer prior to etching. Large, thin diaphragms are suitable for the measurement of low level acoustic signals. Small, thick diaphragms are used for high pressure measurement. A cantilevered proof mass and flexure assembly illustrated in FIG. 6e incorporates a diaphragm-like etching sequence followed by the etching of a trench to complete the formation of the proof mass. A similar procedure is used to define a cantilevered extension of the bimorph configuration as in FIG. 6f. Grinding, polishing and dicing of the substrate produces discrete strain sensor arrays for incorporation into load cells, force sensors, structural health monitoring arrays and acoustic emission sensors. Additional patterning steps are added to provide electrical contact for dissimilar metals encompassing a corrosion sensor. These techniques are apparent to and well understood by those skilled in the art and accordingly, are not specifically treated herein.

Figure 14:
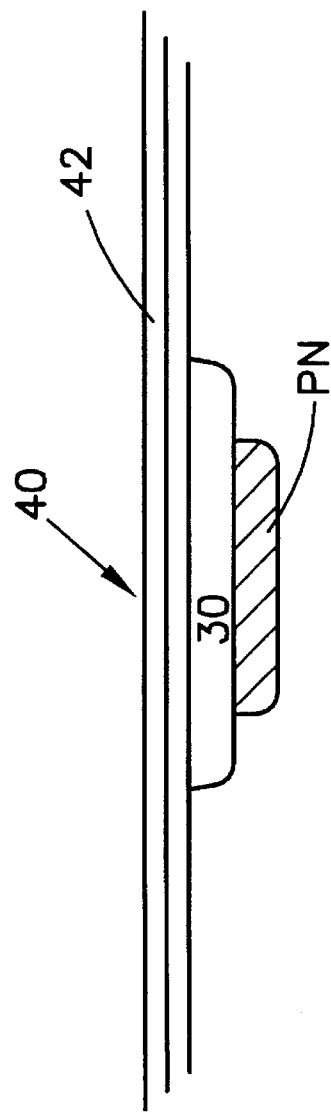
FIG. 14 is a side view of a device in accord with one preferred embodiment not having a top cap or covering capsule.

See also FIG. 14 in which a construction of the device is shown having no overcap, and wherein there may be maintained a vacuum in gap 30 under a flexible diaphragm layer, or in the alternative, the flexible member, 40 may be a beam, either affixed at two ends or cantilevered(not shown) over a gap 30 which may not be a vacuum. An antireflective 42 coating should preferably be used to coat the flexible member with such embodiments.

Numerous minor variations to this process description will occur to those of ordinary skill in the art, all of which are within the scope of this invention which is only limited by the following appended claims.

We claim:

1. A resonant semiconductor microstructure, comprising:

a semiconductor base having a cavity on one side;

a vibratory flexible member formed of a semiconductor material and having at least one portion connected to the semiconductor base proximate the cavity; and forming an integrated optical interference structure in cooperation with at least one other fixed surface of the semiconductor base, so that an amount of incident light energy traverses the vibratory flexible member and is then reflected from the at least one other fixed surface of the semiconductor base thereby creating an optical interference pattern consistent with the vibration of the flexible member.

2. The resonant semiconductor microstructure of claim 1 further comprising a piezoelectric drive means coupled to the flexible member for driving the flexible member at a resonant frequency of said flexible member.

3. The resonant semiconductor microstructure of claim 1 further comprising a photovoltaic drive means formed proximate the flexible member so that incident radiant energy causes the flexible member to resonate at a natural frequency of the flexible member.

4. The resonant semiconductor microstructure of claim 3 wherein the flexible member is formed of fine grain polysilicon.

5. The resonant semiconductor microstructure of claim 4 wherein the photovoltaic drive means comprises a p-n junction formed by doping the semiconductor base and wherein a portion of the p-n junction lies in a surface of the cavity directly below the flexible member.

6. The microstructure of claim 1 further comprising:

a light emitting means optically coupled to the microstructure for producing and directing the incident radiant energy to the flexible member; and, a photodetector disposed proximate the microstructure that receives radiant energy from the microstructure.

7. The microstructure of claim 3 further comprising:

a covering structure formed of a light-admitting semiconductor material and forming a sealed space that encapsulates all exposed sides of the flexible member in cooperation with the cavity on one side of the semiconductor base.

8. The resonant semiconductor microstructure of claim 7 wherein the cavity is evacuated.

9. The microstructure of claim 7 wherein the covering structure is silicon nitride.

10. The resonant semiconductor microstructure of claim 3 wherein the photovoltaic drive means and the flexible member form an integrated monolithic structure.

11. The resonant semiconductor microstructure of claim 3 wherein:

the flexible member is formed of polysilicon, the semiconductor base comprises single crystal silicon, and the photovoltaic drive means is formed in a portion of the cavity in the semiconductor base.

12. The resonant semiconductor microstructure of claim 1 wherein the flexible member comprises fine grain polysilicon.

13. The resonant semiconductor microstructure of claim 1 wherein:

the flexible member comprises a select one of: polycrystalline silicon, GaN, GaAlAs, AlGaN, SiC, diamond, or any suitable III-V or II-VI material; and the semiconductor material comprises a select one of: single crystal silicon, GaN, GaAlAs, AlGaN, SiC, diamond, or any suitable III-V or II-VI material.

14. The resonant semiconductor microstructure of claim 3 wherein the photovoltaic drive means comprises a p-n junction.

15. The microstructure of claim 1 wherein the flexible member is formed as a thinned cantilevered extension of the substrate, and has a coating layer on one side of a specific material so that flexure of the cantilevered extension and consequent shifts in the resonant frequency of the cantilevered extension occurs when the cantilevered extension communicates with a material corresponding to a preselected environmental quality of interest.

16. The microstructure of claim 15 wherein the specific material comprises a select one of the following: a humidity sensitive material, a magnetic material, a piezoelectric material, a chemically sensitive/differentiating material, or a thermally sensitive material having a different thermal coefficient of expansion, and the select environmental quality of interest respectively comprises: humidity, magnetic filed, electric field, chemical species, and temperature.

17. The microstructure of claim 16 further comprising a compensating means for equalizing the effects of a difference in a characteristic thermal response between the cantilevered extension and the specific material, and wherein the compensating means comprises a first coating layer over a first portion of the cantilevered extension with a second coating layer of a material of compensating thermal characteristic covering a second portion of the cantilevered extension.

18. The microstructure of claim 3 further comprising a plurality of flexible members disposed on the semiconductor base which has a like plurality of cavities therein.

19. The resonant semiconductor microstructure of claim 3 wherein:
the photovoltaic drive means comprises a select one of: a metal-semiconductor interface, a partially filled surface state, or a completely filled surface state.

20. A microstructure of claim 1 wherein the microstructure is couples to a surface which conducts acoustic waves having frequency components comparable to a resonant frequency of said flexible member associated with the microstructure.

21. The structure of claim 1 further comprising a plurality of flexible members formed into the semiconductor base and wherein each said flexible member resonates at a different frequency than each of the other plurality of flexible members formed in the semiconductor base.

22. The structure of claim 1 wherein the flexible member is spaced from the semiconductor base and driven by radiant energy modulated at a resonant frequency of the flexible member with a preselected modulation index, so that an optical signal different than the preselected modulation index results.

23. A microstructure of claim 3, wherein a microstructure is fluidly coupled to a gaseous substance, so that the vibration of the flexible member varies when the gaseous substance fluidly interacts with the flexible member.

24. The microstructure of claim 7, further comprising an aperture in the covering structure so that the flexible member fluidly couples to a gaseous substance that changes a pre-existing resonant frequency of the flexible member.

25. The microstructure of claim 24, further comprising a second covering structure forming a hermetic seal around the microstructure so that a resonant frequency of the flexible member changes if the hermetic seal is broken.

26. The resonant semiconductor microstructure of claim 3 wherein the incident radiant energy comprises a select one of the following:
continuous wave, unmodulated light;
modulated light which is modulated at a resonant frequency of the flexible member; or
modulated light, wherein the modulation frequency of the light is swept through a range encompassing a resonant frequency of the flexible member, or
infrequent pulses of light, wherein said pulses occur at a rate substantially lower than the resonant frequency of the flexible member of the microstructure.

27. The microstructure of claim 7 further comprising at least one optical fiber carrying the incident radiant energy.

28. The microstructure of claim 27 further comprising at least one integrated optical waveguide coupling the at least one optical fiber to the covering structure.

29. The microstructure of claim 27 wherein the resonant microstructure is disposed on a deformable diaphragm oriented to respond to fluid pressure.

30. The microstructure of 27 further comprising a light focusing means coupled to the optical fiber for concentrating the incident radiant energy on the flexible member.

31. The microstructure of claim 27 wherein the at least one optical fiber comprises a select one of: a combination multi-mode/single-mode optical fiber, a combination glass/resin optical fiber, or a multi-mode-only optical fiber.

32. The microstructure of claim 30, further comprising a collimating lens optically coupled to the optical fiber so that the incident radiant energy focuses on the photovoltaic drive means.

33. A microstructure of claim 1, wherein at least two opposing end portions of the flexible member are fixed to the semiconductor substrate and thereby adapted to respond to an imposed magnetic field, and wherein:
the displacement of the flexible member results from a combination of photo-induced electrical current flowing through the flexible member and the presence of a dc magnetic field.

34. The microstructure of claim 1 wherein the flexible member is attached to the base at more than one place and is free to vibrate, and wherein the resulting frequency of vibration of the flexible member is determined in part by the direction and magnitude of stress applied to the flexible member through the locations of attachment to the base.

35. The structure of claim 6, wherein the light emitting means comprises a diode.

36. The microstructure of claim 1, further comprising at least one electrode means for changing the amplitude or frequency of the vibrations of the flexible member in response to the application of electrical potential to the electrode.

37. A microstructure of claim 36 adapted to respond to the presence of an electrolyte material disposed proximate or within a surface bearing said microstructure, and further comprising:
at least two electrodes, each fabricated from a dissimilar material, wherein a first electrode electrically coupled to the photovoltaic structure and electrically isolated from the semiconductor substrate and a second electrode electrically isolated from the first electrode and disposed to contact a portion of the electrolyte material so that resonance of the flexible beam changes or stops when either the first or the second electrode contacts a portion of the electrolyte material.

38. A strain sensor, comprising the microstructure of claim 27 mechanically coupled to a surface to be monitored for strain, and wherein the microstructure is coupled so that the flexible member is disposed longitudinally to the strain in the surface to be monitored.

39. The strain sensor of claim 38, wherein the flexible member spans the cavity and connects at opposing sides of said cavity.

40. An accelerometer, comprising the microstructure of claim 7 physically coupled to a flexible but non-resonant flexure member which is further physically coupled to a proof-mass member.

41. The structure of claim 1 wherein the microstructure is disposed on a lateral surface of a rotating shaft.

42. The sensor of claim 41 further comprising an optical fiber fixed to a stationary member proximate the rotating shaft to provide an output related to the torque present in the rotating shaft.

43. A strain sensor array of a plurality of resonant semiconductor microstructures, comprising:

a semiconductor base having a plurality of cavities therein;

a plurality of vibratory flexible members corresponding to the cavities, and formed integrally of a semiconductor material and having at least one portion connected to the semiconductor base proximate a cavity; and forming an optical interference structure in cooperation with at least one other fixed surface of the semiconductor base, so that an amount of incident light energy traverses the vibratory flexible member and is then reflected from the at least one other fixed surface of the semiconductor base thereby creating an optical interference pattern consistent with the vibration of the flexible member; and wherein at least two of the plurality of flexible members are oriented orthogonal from each other on the semiconductor base to optimize sensitivity to two-dimensional strain.

44. The microstructure of claim 4 further comprising an anti-reflection coating over at least a portion of the covering structure.

45. The microstructure of claim 3, wherein the flexible member is formed generally in a rectangular shape and wherein a center portion of the flexible member has an enlarged center region.

46. The microstructure of claim 3, wherein the flexible member is formed in a rectangular shape and the flexible member has at least one lateral attachment means.

47. A microstructure that vibrates in response to incident light directed at the microstructure, comprising:

a semiconductor base having a cavity in one side;

a first flexible beam member that transmits a majority of said incident light directed thereon and formed integrally of a semiconductor material and having a distal end connected to the semiconductor base proximate the cavity and a proximal end connected to the semiconductor base so that the flexible beam member spans the cavity; and, a first photovoltaic drive structure disposed so that a portion lies within the cavity.

48. The microstructure of claim 47 further comprising a second flexible beam member similar in dimension to the first flexible beam member, coupled to the first flexible beam member and spaced from the first flexible beam member by a recess so that the distal ends of both the first and second flexible beam members lie proximate to the other and the proximal ends of the first flexible beam member and the second flexible beam member lie proximate to each other.

49. The microstructure of claim 48, wherein the first and second flexible beam members are formed of single crystal semiconductor material and further comprising a second photovoltaic drive structure disposed in a select one of the following locations: the semiconductor base, the first flexible beam member, or the second flexible beam member.

* * * * *

UNITED STATES PATENT AND TRADEMARK OFFICE
CERTIFICATE OF CORRECTION

PATENT NO.   : 5,559,358
DATED        : September 24, 1996
INVENTOR(S)  : David W. Burns, et al It is certified that error appears in the above-identified patent and that said Letters Patent is hereby corrected as shown below:

Column 1, line 4, insert

--U.S. Government Rights

The Government has rights in this invention pursuant to Contract No. F33615-90-C-1495, awarded by the Department of the Air Force.--

Signed and Sealed this

Third Day of February, 1998

Attest:

BRUCE LEHMAN

Attesting Officer      Commissioner of Patents and Trademarks